(12) United States Patent
Phatak et al.

(10) Patent No.: US 9,040,465 B2
(45) Date of Patent: May 26, 2015

(54) DIELECTRIC DOPING USING HIGH PRODUCTIVITY COMBINATORIAL METHODS

(71) Applicant: Intermolecular Inc., San Jose, CA (US)

(72) Inventors: Prashant B Phatak, San Jose, CA (US); Venkat Ananthan, Cupertino, CA (US); Wayne R French, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 232 days.

(21) Appl. No.: 13/680,701

(22) Filed: Nov. 19, 2012

(65) Prior Publication Data
US 2014/0141534 A1 May 22, 2014

(51) Int. Cl.
*C40B 50/00* (2006.01)
*H01L 21/66* (2006.01)
*C23C 14/04* (2006.01)

(52) U.S. Cl.
CPC ............. *H01L 22/20* (2013.01); *C23C 14/042* (2013.01); *B01J 2219/00274* (2013.01)

(58) Field of Classification Search
USPC ................ 438/5, 14, 478, 493; 506/23
See application file for complete search history.

(56) References Cited

U.S. PATENT DOCUMENTS

2009/0061083 A1* 3/2009 Chiang et al. ............. 427/248.1
2013/0056836 A1* 3/2013 Yu et al. .................... 257/410

OTHER PUBLICATIONS

Hashim, I., et al.; Combinatorial PVD and ALD workflows for cost-effective R&D Electro IQ; Mar. 1, 2009; Intermolecular; 7 pages.

* cited by examiner

*Primary Examiner* — Jamie C Niesz

(57) ABSTRACT

A combination of deposition processes can be used to evaluate layer properties using a combinatorial workflow. The processes can include a base ALD process and another process, such as a PVD process. The high productivity combinatorial technique can provide an evaluation of the material properties for given ALD base layer and PVD additional elements. An ALD process can then be developed to provide the desired layers, replacing the ALD and PVD combination.

19 Claims, 18 Drawing Sheets

Providing a substrate comprising a plurality of site isolated regions
960

Sequentially depositing one or more layers using ALD processes and one or more layer using PVD processes in each site isolated region, wherein a characteristic of at least a layer is varies in a combinatorial manner
970

Measuring a characteristic of the layers within each site isolated region
980

Developing an ALD process to obtain optimized layer characteristics
990

DIELECTRIC DOPING USING HIGH PRODUCTIVITY COMBINATORIAL METHODS

TECHNICAL FIELD

The present invention relates generally to combinatorial methods for material development.

BACKGROUND

Advances in semiconductor processing have demanded ever-increasing high functional density with continuous size scaling. This scaling process has led to the adoption of high-k gate dielectrics and metal gate electrodes in metal gate stacks in semiconductor devices.

High-k gate dielectrics can offer a way to scale down the thickness of the gate dielectric with acceptable gate leakage current. The use of high-k gate dielectrics is often accompanied by a metal gate electrode, since thin gate dielectric layers may cause poly depletion, affecting the device operation and performance. Metal gate electrodes further have an advantage of higher electrical conductance, as compared to poly gates, and thus can improve signal propagation times.

The manufacture of high-k dielectric devices entails the integration and sequencing of many unit processing steps, with potential new process conditions and sequences, since in general, high-k gate dielectrics are much more sensitive to process conditions than silicon dioxide. For example, different combinations of high-k dielectric and metal electrode can exhibit different device characteristics such as effective work function, affecting subsequent fabrication processes, and consequently the performance of the high-k gate structures. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD). However, HPC processing techniques have not been successfully adapted to the development of gate stack characteristics, such as effective work function, to evaluate materials and process conditions for optimal high-k device performance.

Therefore, there is a need to apply high productivity combinatorial techniques to the development and investigation of materials for the manufacture of high-k devices.

SUMMARY

In some embodiments, high productivity combinatorial (HPC) methods and systems for evaluating materials and processes for ALD process development are provided. The methods can include a combinatorial ALD process, and/or a combinatorial PVD process, together with additional support processes such as cleaning, shadow mask or lithography patterning for forming device structures.

In some embodiments, a combination of an ALD process and another process, such as PVD or CVD process, is used to deposit multiple layers in site isolated regions. At least a characteristic of the layers is varied in a combinatorial manner, allowing a screening of the properties of the layers.

In some embodiments, base layers are deposited using an ALD process. The ALD base layers can be modified, e.g., incorporating an additional element, by a PVD process. The modified base layers can be deposited in site isolated regions, allowing a combinatorial screening of the properties of the layers. The PVD process that can provide desired properties can be optionally converted to an ALD process, for example, by developing a precursor that can incorporate the same element characteristics to the ALD base layers. The ALD process, converted from the PVD process, can be incorporated into the base ALD process, forming an ALD process that can deliver the layers with the desired properties.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
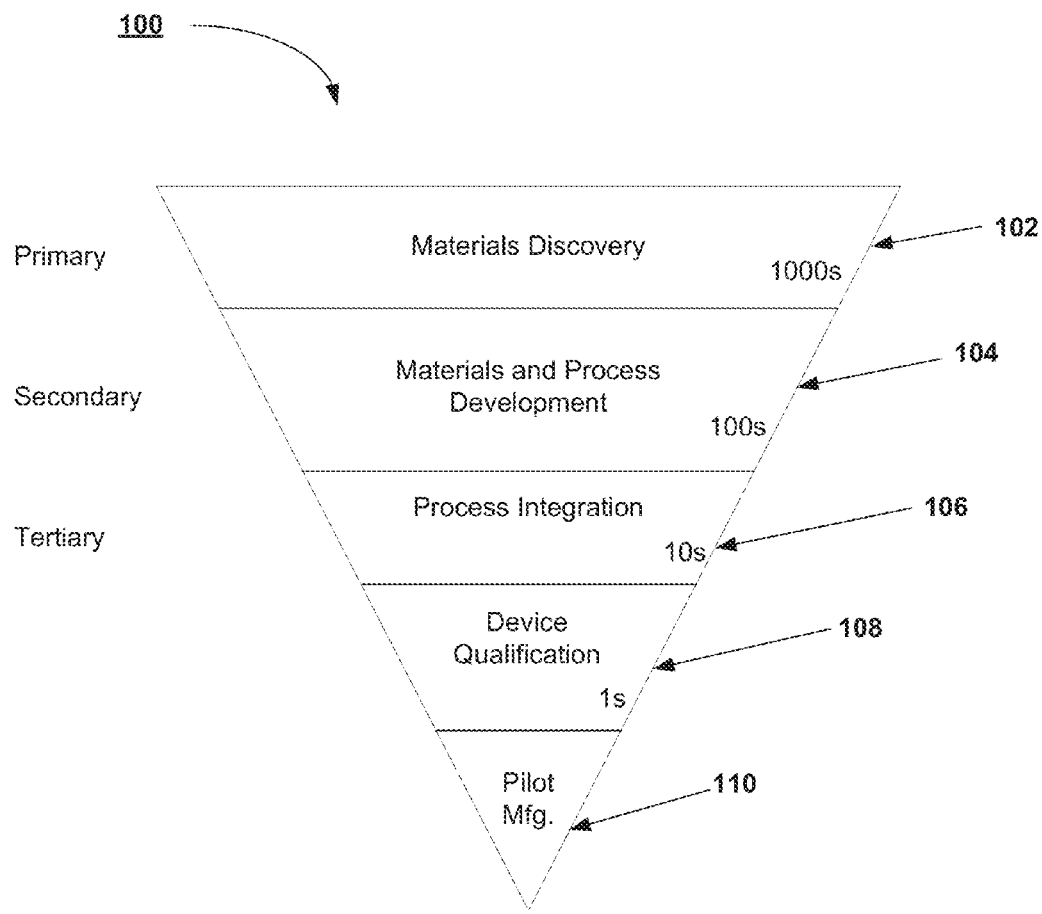
FIG. 1 illustrates a schematic diagram for implementing combinatorial processing and evaluation using primary, secondary, and tertiary screening.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In some embodiments, combinatorial methods to evaluate deposited layers, including dielectric layers, are disclosed. The methods can include a combination of atomic layer deposition (ALD) process, and another process, such as physical vapor deposition (PVD) process. For example, the methods can include using PVD process to introduce one or more elements to a layer deposited by an ALD process. In the following description, PVD is described in detail as the supplemental process for incorporate with ALD process. Other processes can also be used, such as chemical vapor deposition (CVD) or reactive annealing, in which additional elements can be introduced to the ALD base layers.

In some embodiments, the elements provided by the PVD process can include a minor constituent, e.g., less than 50 at % of the resulting layer. For example, a base layer can be deposited by an ALD process, and the PVD process can provide addition elements, e.g., dopants, to the base layer, to form a composite material. The combinatorial methods can be used to achieve layers with desired characteristics. In addition, the combinatorial methods can facilitate the development of an ALD process, e.g., the development of an ALD process to achieve the composite layer.

In the following description, illustrative methods for determining effective work function values are illustrated using simple planar structures and process flows. Those skilled in the art will appreciate that the description and teachings to follow can be readily applied to any simple or complex testing methodology. The drawings are for illustrative purposes only and do not limit the application of the present invention.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

FIG. 1 illustrates a schematic diagram for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of high-k device fabrication process with metal gate by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the high-k device. For example, such structures may include, but would not be limited to, high-k dielectric layers, metal gate layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
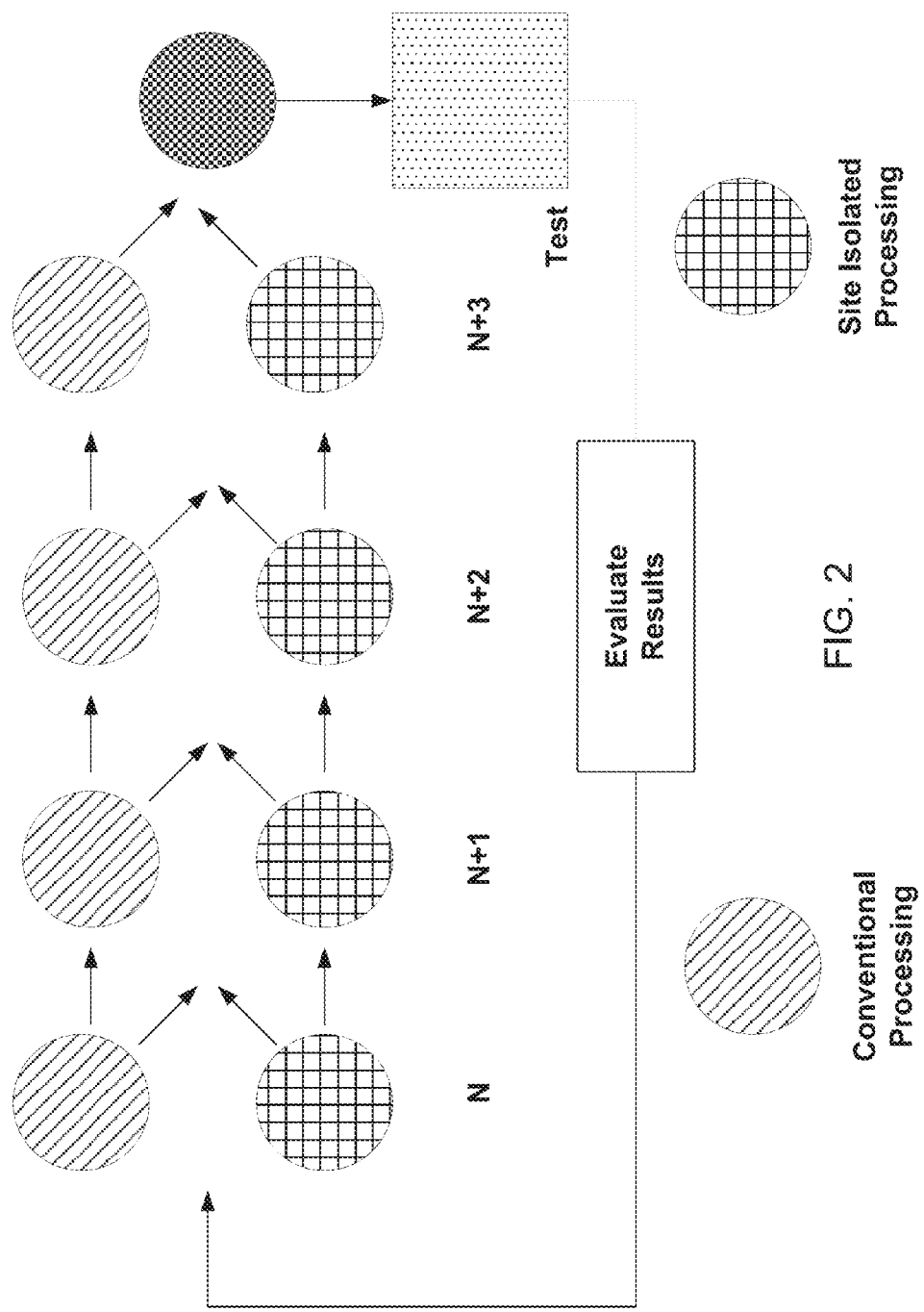
FIG. 2 is a simplified schematic diagram illustrating a general methodology for combinatorial process sequence integration that includes site isolated processing and/or conventional processing according to some embodiments.

FIG. 2 is a simplified schematic diagram illustrating a general methodology for combinatorial process sequence integration that includes site isolated processing and/or conventional processing according to some embodiments. In some embodiments, the substrate is initially processed using conventional process N. In some embodiments, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

In some embodiments, layers having different materials and/or process conditions are fabricated and tested to evaluate their characteristics and behaviors, for example, to identify their dielectric constant values, or their leakage current characteristics. Advanced semiconductor devices can employ novel materials such as metal gate electrodes and high-k dielectrics, which include dielectric materials having a dielectric constant greater than that of silicon dioxide. Typically high-k dielectric materials include aluminum oxide, hafnium oxide, zirconium oxide, tantalum oxide, titanium oxide, or their alloys such as hafnium silicon oxide or zirconium silicon oxide. Metal gate materials typically comprise a refractive metal or a nitride of a refractive metal, such as titanium nitride, titanium aluminum nitride, or titanium lanthanum nitride. Different high-k dielectric materials exhibit different dielectric constants and different leakage currents, together with different integration behavior with metal gate materials, leading to the need to screen the various high-k dielectric and metal gate materials to meet device performance levels.

In some embodiments, methods to deposit layers having different materials on a substrate are provided, including a combination of PVD and ALD processes. ALD process can provide thin conformal layers, thus can be suitable for advanced semiconductor devices. ALD chemistries can be highly demanding, for example, requiring high volatile precursors with saturated surface reaction, thus ALD materials can be limited to the available precursors. Improved materials can be known, for example, by achieving layers deposited by PVD process. However, developing ALD precursors to achieve the required layer compositions can be difficult. In addition, layers deposited by ALD process might not exhibit the same characteristics or behaviors as the layer deposited by PVD process, even with though the compositions are similar.

In some embodiments, ALD base layers are complemented by PVD dopants to generate layers having desired composition. The desired layer characteristics can be achieved with a combination, e.g., a sequence deposition process, of ALD and PVD processes. Additionally, an all ALD process can be developed. Since the base materials are already deposited by ALD, the development can be significantly simpler, in which only dopant precursors are needed to be developed for the ALD process.

In some embodiments, combinatorial workflows for evaluating material characteristics and behaviors using ALD base process and PVD dopant process are provided. High productivity combinatorial processing can be a fast and economical technique for screening materials to determine their proper process integration in advanced semiconductor devices, allowing the development of ALD precursors and ALD processes that can provide that materials.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
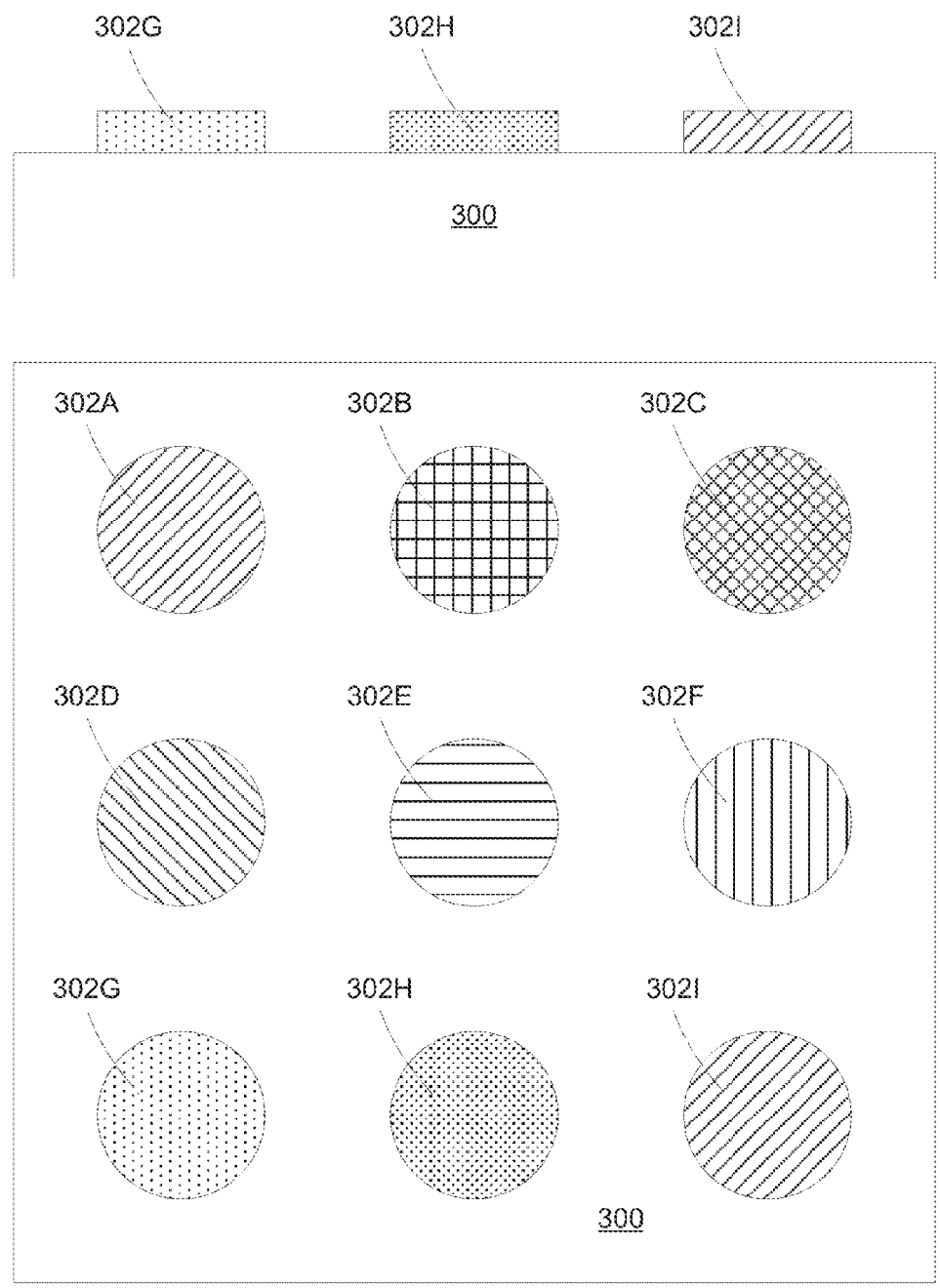
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

In some embodiments, the dielectric layer is formed through a deposition process, such as chemical vapor deposition (CVD), atomic layer deposition (ALD), or physical vapor deposition (PVD). The metal electrode layer can be formed by PVD, CVD or ALD through a shadow mask or by a lithography patterning process.

Figure 4:
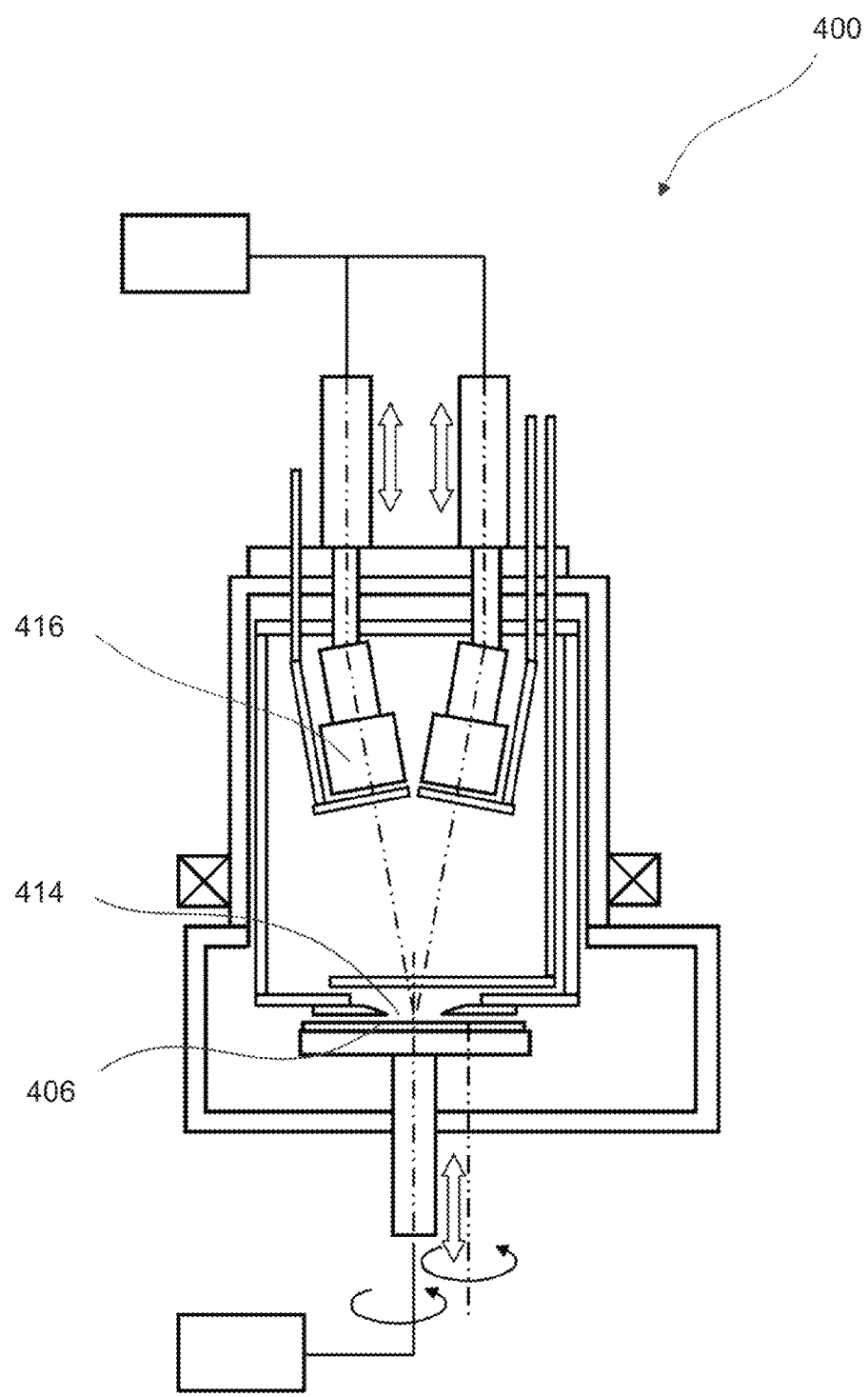
FIG. 4 illustrates a simplified schematic diagram illustrating a PVD process chamber configured to perform combinatorial processing.

FIG. 4 illustrates a simplified schematic diagram illustrating a PVD process chamber configured to perform combinatorial processing. The PVD system 400, sometimes commonly called a sputter system, generally includes a process chamber, one or more sputtering sources, and a transport system capable of positioning the substrate such that any area of the substrate can be exposed to sputtered material. The apparatus can further include an aperture positioned under each sputtering source, with the aperture oriented normal to the substrate and located adjacent to but not touching the substrate. The aperture typically has an opening smaller than the substrate so that discrete regions of the substrate can be subjected to distinct process conditions in a combinatorial manner. However, there is no particular limit on the size of the aperture. Typical apertures can range from a minimum of about 10 mm in one dimension, and can be square, round, or rectangular, for example. For combinatorial processing, the apertures are small enough such that films can be deposited on a plurality of site-isolated regions on a substrate. For high deposition rate sputtering to coat an entire substrate, the aperture can be up to approximately full substrate size.

The process chamber provides a controlled atmosphere so that sputtering can be performed at any gas pressure or gas composition necessary to perform the desired combinatorial processing. Typical processing gases include argon, oxygen, hydrogen, or nitrogen. However, additional gases can be used as desired for particular applications.

The transport system can include a substrate support capable of controlling substrate temperature up to about 550 C, and applying a bias voltage of a few hundred volts.

In a sputter system 400, a plurality of sputtering sources 416 are positioned at an angle so that they can be aimed through a single aperture 414 to a site-isolated region on a substrate 406. The sputtering sources 416 are positioned about 100-300 mm from the aperture 414 to ensure uniform flux to the substrate within the site-isolated region. Details of the combinatorial PVD system are described in U.S. patent application Ser. No. 12/027,980 filed on Feb. 7, 2008 and U.S. patent application Ser. No. 12/028,643 filed on Feb. 8, 2008, which are herein incorporated by reference.

In some embodiments, a deposition process can be performed in the sputter system 400 in a combinatorial manner. The combinatorial deposition process generally includes exposing a first site-isolated region of a surface of a substrate to material from a sputtering source under a first set of process parameters, and exposing a second site-isolated region of a surface of the substrate to material from a sputtering source under a second set of process parameters. During exposure of the surface of the substrate to the sputtering source, the remaining area of the substrate is not exposed to the material from the sputtering target, enabling site-isolated deposition of sputtered material onto the substrate. The combinatorial process can further include exposing three or more site-isolated regions of the substrate to material from a sputtering source under distinct sets of process parameters. The combinatorial process can further comprise depositing additional layers onto any site-isolated region to build multi-layered structures if desired. In this manner, a plurality of process conditions to deposit one or a plurality of layers can be explored on a single substrate under distinct process parameters.

The process parameters that can be combinatorially varied generally comprise sputtering parameters, sputtering atmosphere parameters, substrate parameters, or combinations thereof. Sputtering parameters typically comprise exposure times, power, sputtering target material, target-to-substrate spacing, or a combination thereof. Sputtering atmosphere parameters typically comprise total pressure, carrier gas composition, carrier gas flow rate, reactive gas composition, reactive gas flow rate, or combinations thereof. The reactive gas flow rate can be set to greater than or equal to zero in order to vary the reactive gas composition in an inert carrier gas. The substrate parameters typically comprise substrate material, surface condition (e.g., roughness), substrate temperature, substrate bias, or combinations thereof.

Substrates can be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

Figure 5:
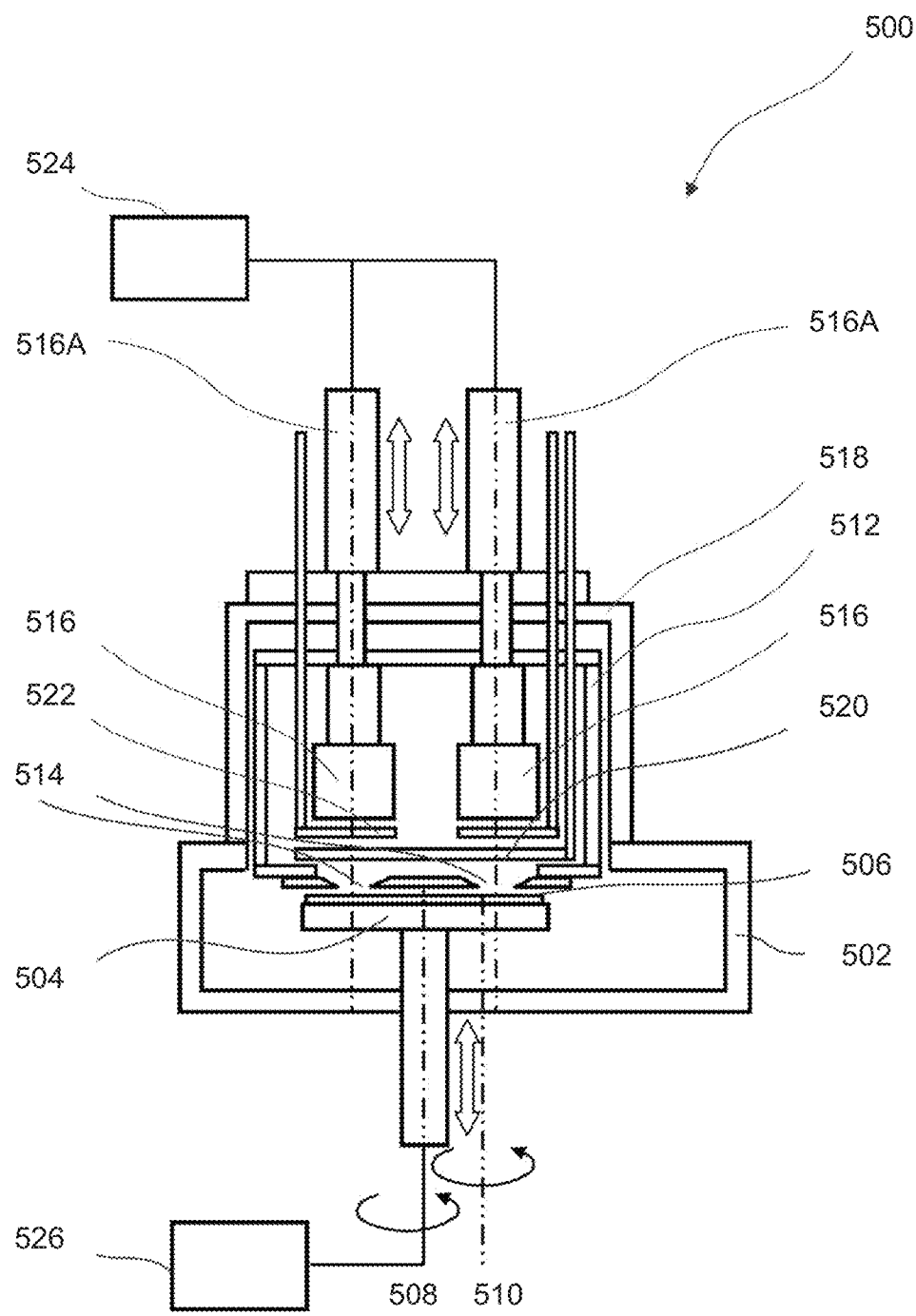
FIG. 5 is a simplified schematic diagram illustrating another sputter chamber configured to perform combinatorial processing according to some embodiments.

FIG. 5 is a simplified schematic diagram illustrating another sputter chamber configured to perform combinatorial processing according to some embodiments. Processing chamber 500 includes a bottom chamber portion 502 disposed under top chamber portion 518. Within bottom portion 502, substrate support 504 is configured to hold a substrate 506 disposed thereon and can be any known substrate support, including but not limited to a vacuum chuck, electrostatic chuck or other known mechanisms. Substrate support 504 is capable of both rotating around its own central axis 508 (referred to as "rotation" axis), and rotating around an exterior axis 510 (referred to as "revolution" axis). Such dual rotary substrate support can be useful for combinatorial processing using site-isolated mechanisms. Other substrate supports, such as an X-Y table, can also be used for site-isolated deposition. In addition, substrate support 504 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 526 provides a bias power to substrate support 504 and substrate 506, and produces a bias voltage on substrate 506. Substrate 506 can be a conventional round 200 mm, 300 mm, or any other larger or smaller substrate/wafer size. In other embodiments, substrate 506 can be square, rectangular, or other suitable shape. One skilled in the art will appreciate that substrate 506 can be a blanket substrate, a coupon (e.g., partial wafer), or even a patterned substrate having predefined regions. In another embodiment, substrate 506 can have regions defined through the processing described herein.

Top chamber portion 518 of chamber 500 in FIG. 5 includes shield 512, which defines a confinement region over a radial portion of substrate 506. Shield 512 is a sleeve having a base (optionally integrated with the shield) and an optional top within chamber 500 that can be used to confine a plasma generated therein. The generated plasma dislodges atoms from a sputtering target (causing material to be ejected from the sputtering target) and the sputtered atoms are deposited on a site-isolated region of the substrate 506. Deposition can be performed in an inert gas atmosphere (e.g., an argon carrier gas) to deposit materials such as pure metals, or in the presence of reactive gases such as nitrogen or oxygen to deposit molecules such as metal oxides or metal nitrides. Neutral atoms or molecules (optionally in an excited electronic state) can be deposited. Alternatively, ions can be deposited, in which case a substrate bias voltage can be used advantageously to tune the energy of the ions arriving at the site-isolated region. Chamber pressure and gas flow rates can be adjusted to control the process; for example, the stoichiometry of layers formed in a reactive atmosphere can be tuned by adjusting the relative flow rate of the reactive gas(es).

Shield 512 is capable of being moved in and out of chamber 500, i.e., the shield is a replaceable insert. Shield 512 includes an optional top portion, sidewalls and a base. In some embodiments, shield 512 is configured in a cylindrical shape, however, the shield may be any suitable shape and is not limited to a cylindrical shape.

The base of shield 512 includes a plurality of apertures 514 in an aperture plate through which one or more site-isolated region of the surface of substrate 506 is exposed for deposition or some other suitable semiconductor processing operations. Aperture shutter 520 is moveably disposed over the base of shield 512. In some embodiments, aperture shutter 520 can be moved across a bottom surface of the base of shield 512 in order to cover or expose one or more apertures 514. Typically, only one aperture is uncovered at any one time to prevent cross-contamination between site-isolated regions. In some embodiments, aperture shutter 520 is controlled through an arm extension which moves the aperture shutter to expose or cover an aperture 514. It should be noted that although a single aperture per sputtering source is illustrated, multiple apertures may be included for each sputtering source. Each aperture can be associated with a dedicated aperture shutter or an aperture shutter can be configured to cover more than one aperture simultaneously or separately. Alternatively, aperture 514 can be a larger opening and aperture shutter 520 can extend with that opening to either completely cover the aperture or place one or more fixed apertures within that opening for processing the defined regions. The dual rotary substrate support 504 is useful to the site-isolating mechanism, and allows any location of the substrate or wafer to be placed under the aperture 514. Hence, site-isolated deposition is possible at any location on the wafer/substrate.

A sputtering source shutter, 522 can also be included. Sputtering source shutter 522 functions to seal off a deposition source when the deposition source may not be used for the processing in some embodiments. For example, two sputtering sources 516 are illustrated in FIG. 5. Sputtering sources 516 are moveable in a vertical direction so that one or both of the sources can be lifted from the slots of the shield. While two sputtering sources are illustrated, any number of sputtering sources can be included, constrained only by space limitations, e.g., one, three, four or more sputtering sources can be included. Typical embodiments for combinatorial processing can include 4 to 6 sputtering sources. Where more than one sputtering source is included, the plurality of sputtering sources may be referred to as a cluster of sputtering sources. Sputtering source shutter 522 can be moved to isolate the lifted sputtering sources from the processing area defined within shield 512. In this manner, the sputtering sources can be isolated from certain processes when desired. It should be appreciated that sputtering source shutter 522 can be integrated with the top of the shield 512 to cover the opening as the sputtering source is lifted or a sputtering source shutter 522 can be used for each site-isolated region.

Top chamber portion 518 of chamber 500 of FIG. 5 includes sidewalls and a top plate which house shield 512. Arm extensions 516a, which are fixed to sputtering sources 516 can be attached to a suitable drive, e.g., lead screw, worm gear, etc., configured to vertically move sputtering sources 516 toward or away from a top plate of top chamber portion 518. In typical use for high deposition rate sputtering, the sputtering target is positioned such that the target-to-substrate spacing is from about 20 mm to about 100 mm from the substrate, which is much closer than the typical spacing of 80-300 mm used in most sputtering systems. In some embodiments, the target-to-substrate spacing is from about 50 mm to about 75 mm. A larger spacing can reduce the deposition rate while a smaller spacing can make it difficult to strike and sustain the plasma.

Atomic layer deposition (ALD) as used herein refers to the sequential introduction of two or more reactive compounds to deposit a layer of material on a substrate surface. The two, three or more reactive compounds may alternatively be introduced into a reaction zone of a deposition chamber. Usually, each reactive compound is separated by a time delay to allow each compound to adhere and/or react on the substrate surface. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition. In either scenario of a continuous or intermittent purge gas flow, the ALD process of pulsing compound A, purge gas, pulsing compound B, and purge gas is an ALD cycle. An ALD cycle can start with either compound A or compound B and continue the respective order of the ALD cycle until achieving a film with the desired thickness. In some embodiments, a first precursor or compound A is pulsed into the reaction zone of a deposition chamber (e.g., ALD chamber) followed by a first time delay. Next, a second precursor or compound B is pulsed into the reaction zone followed by a second delay. Next, a third precursor or compound C is pulsed into the reaction zone followed by a third delay. During each time delay a purge gas, such as argon or nitrogen, may be pulsed or otherwise provided into the deposition chamber to purge the reaction zone or otherwise remove any residual reactive compound or by-products from the reaction zone or other surfaces. Alternatively, the purge gas may flow continuously throughout the deposition process so that only the purge gas flows during the time delay between pulses of reactive compounds. The reactive compounds are alternatively pulsed until a desired film or film thickness is formed on the substrate or deposition surface. In either scenario of a continuous or intermittent purge gas flow, the ALD process of pulsing compound A, purge gas, pulsing compound B, purge gas, pulsing compound C, and purge gas is an ALD cycle. Alternatively, the ALD process of pulsing compound A, purge gas, pulsing compound B, purge gas, pulsing compound C, purge gas, pulsing compound B, and purge gas is an ALD cycle. An ALD cycle can start with either compound A, compound B, or compound C and continue the respective order of the ALD cycle until achieving a film with the desired thickness.

A "pulse" as used herein is intended to refer to a quantity of a particular compound that is intermittently or non-continuously introduced into a reaction zone of a processing chamber. The quantity of a particular compound within each pulse may vary over time, depending on the duration of the pulse. The duration of each pulse is variable depending upon a number of factors such as, for example, the volume capacity of the deposition chamber employed, the vacuum system coupled thereto, and the volatility/reactivity of the particular compound itself. A "half-reaction" as used herein is intended to refer to a pulse of precursor step followed by a purge step.

Examples of suitable metal oxide dielectric materials include hafnium oxide ($Hf_xO_y$), tantalum oxide ($Ta_xO_y$), aluminum oxide ($Al_xO_y$), lanthanum oxide ($La_xO_y$), yttrium oxide ($Y_xO_y$), dysprosium oxide ($Dy_xO_y$), ytterbium oxide ($Yb_xO_y$), zirconium oxide ($Zr_xO_y$), titanium oxide ($TiO_x$), nickel oxide ($NiO_x$) cerium oxide ($CeO_x$), zinc oxides ($Zn_xO_y$), copper oxides ($Cu_xO_y$), with their stoichiometric, nonstoichiometric and doped variants can be used.

In some embodiments, atomic layer deposition (ALD) can be used for depositing a base layer. The base layer can be deposited using thermal ALD processes and/or plasma-enhanced ALD (PE-ALD). The ALD processes for depositing layers within the memory device are typically conducted in a deposition chamber, such as an ALD chamber. The deposition chamber may maintain an internal pressure of less than 760 Torr, such as within the range from about 10 mTorr to about 10 Torr, such as from about 100 mTorr to about 1 Torr, for example, about 350 mTorr. The temperature of the memory device, the substrate, or the substrate carrier/pedestal is usually maintained within the range from about 50° C. to about 1,000° C., such as from about 100° C. to about 500° C., such as from about 200° C. to about 400° C., or such as from about 250° C. to about 300° C. The ALD process can include the sequential introduction of multiple precursors, such as a metal source gas and an oxidizing agent. The following description specifically refers to a metal source gas and an oxidizing agent, but other precursors can be used.

The metal source gas may be pulsed into the deposition chamber at a flow rate within the range from about 0.1 sccm to about 200 sccm, such as from about 0.5 sccm to about 50 sccm, from about 1 sccm to about 30 sccm, for example, about 10 sccm. The metal source gas may be provided along with a carrier gas, such as argon or nitrogen. The carrier gas may have a flow rate within the range from about 1 sccm to about 300 sccm, such as from about 2 sccm to about 80 sccm, from about 5 sccm to about 40 sccm, for example, about 20 sccm.

The metal source gas may be provided into the deposition chamber for a time within a range from about 0.01 seconds to about 120 seconds, depending on the particular process conditions, metal source gas or desired composition of the deposited metal oxide material. The metal source gas can include a metal organic precursor comprising an organic ligand. For example, the metal source can be a hafnium precursor which is a tetrakis(dialkylamino)hafnium compound, such as tetrakis(dimethylamino)hafnium (($Me_2N)_4Hf$ or TDMAH), tetrakis(diethylamino)hafnium (($Et_2N)_4Hf$ or TDEAH), or tetrakis (ethylmethylamino)hafnium (($EtMeN)_4Hf$ or TEMAH).

The metal source gas can be dispensed into a deposition chamber by introducing a carrier gas through an ampoule containing the metal source or metal organic precursor. An ampoule unit may include an ampoule, a bubbler, a canister, a cartridge, or other container used for storing, containing, or dispersing chemical precursors. In another example, the ampoule may contain a liquid precursor (e.g., TDMAH or TDEAH) and be part of a liquid delivery system containing an injector valve system used to vaporize the liquid precursor with a heated carrier gas. Generally, the ampoule may be heated to a temperature of about 200° C. or less, such as within a range from about 30° C. to about 90° C., for example, about 50° C.

The oxidizing agent (e.g., $O_2$, $O_3$, or $H_2O$) may be provided into the deposition chamber at a flow rate within a time from about 0.01 seconds to about 120 seconds, depending on the particular process conditions, oxygen source gas or oxidizing agent or desired composition of the deposited metal oxide material. The oxidizing agent may contain or be formed of or generated from an oxygen source that includes oxygen ($O_2$), atomic oxygen (O), ozone ($O_3$), nitrous oxide ($N_2O$), nitric oxide (NO), nitrogen dioxide ($NO_2$), dinitrogen pentoxide ($N_2O_5$), hydrogen peroxide ($H_2O_2$), derivatives thereof, plasmas thereof, or combinations thereof. Ozone may be formed inside or outside of the deposition chamber, such as the ALD chamber. In some embodiments, the oxidizing agent contains ozone formed by an ozone generator positioned outside the deposition chamber. Ozone is generated and then flowed or directed into the deposition chamber and exposed along with the metal source gas to the substrate surface. In some embodiments, the oxidizing agent contains ozone formed by a plasma generated within the interior of the deposition chamber. Oxygen gas flowed or directed into the deposition chamber, then ignited or formed into ozone and/or atomic oxygen before being sequentially exposed along with the metal source gas to the substrate surface.

A carrier gas or a purge gas may be provided at the same time as the metal source gas and/or the oxygen source, but is also provided between the pulses of the metal source gas and/or the oxygen source. The carrier gas or purge gas may flow continuously during the ALD process or may be intermediately and/or sequentially pulsed, introduced, or otherwise provided during the ALD. The carrier gas or purge gas may be provided into the deposition chamber at a rate within a range from about 1 second to about 120 seconds, depending on the particular process conditions, source gases, or desired composition of the deposited metal oxide material.

The carrier gas or purge gas may contain nitrogen, argon, helium, hydrogen, a forming gas, oxygen, mixtures thereof, or combinations thereof. The carrier gas or the purge gas may be sequentially provided after each pulse of the metal source gas and each pulse of the oxidizing agent during the ALD cycle. The pulses of purge gas or carrier gas are typically provided at a flow rate within a range from about 2 standard liters per minute (slm) to about 22 slm, such as about 10 slm. The specific purge gas flow rates and duration of process cycles are obtained through experimentation. In some embodiments, a 300 mm diameter wafer requires about twice the flow rate for the same duration as a 200 mm diameter wafer in order to maintain similar throughput.

Figure 6A:
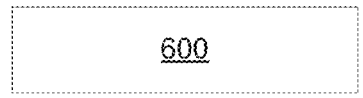
FIGS. 6A-6F illustrate an example of a process flow schematic of an ALD deposition of an aluminum oxide base layer according to some embodiments.
Figure 6B:
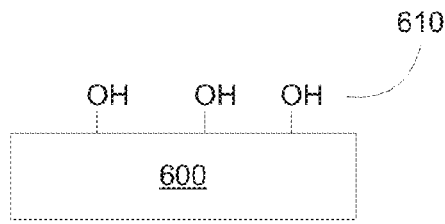

FIGS. 6A-6F illustrate an example of a process flow schematic of an ALD deposition of an aluminum oxide base layer according to some embodiments. In FIG. 6A, a substrate 600 is provided in a process chamber. The substrate can be a semiconductor substrate or a support substrate. In some embodiments, the substrate 600 is already processed to form appropriate structures for resistive memory devices. For example, a polysilicon layer can be formed on the substrate 600, acting as a bottom electrode for the to-be-deposited aluminum oxide switching layer. In FIG. 6B, the substrate surface is conditioned for ALD deposition, for example, by providing an OH terminated surface 610. The OH surface 610 can be prepared by exposing the substrate to water.

Figure 6C:
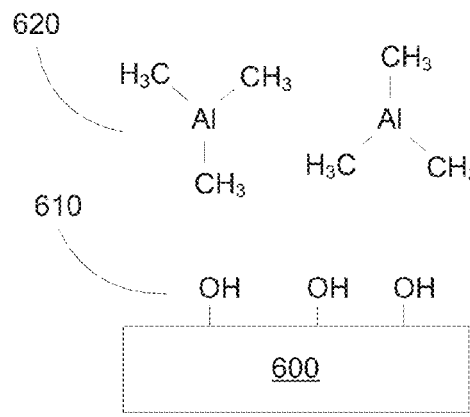
Figure 6D:
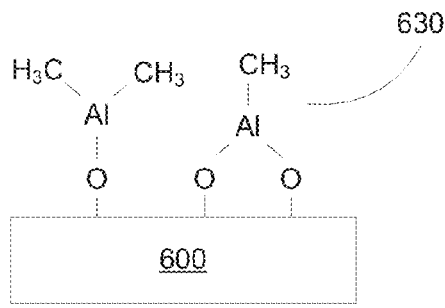
Figure 6E:
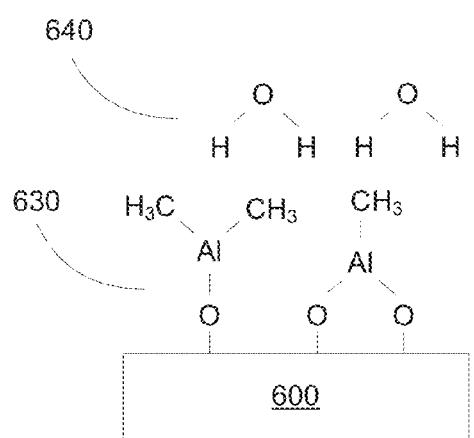
Figure 6F:
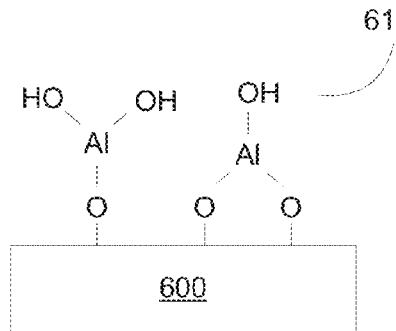

In FIG. 6C, trimethylaluminum ($Al(CH_3)_3$) precursor 620 is introduced to the process chamber. In FIG. 6D, trimethylaluminum precursor reacts with the OH surface to form aluminum oxide bonding 630. The un-reacted trimethylaluminum precursor is purged from the chamber. In FIG. 6E, water 640 is introduced to the process chamber. In FIG. 6F, water molecules react with aluminum surface 630 to conditioning the substrate surface to OH terminated surface 610*. The process cycle continues, for example, by introducing trimethylaluminum precursor to react with OH terminated surface.

Figure 7A:
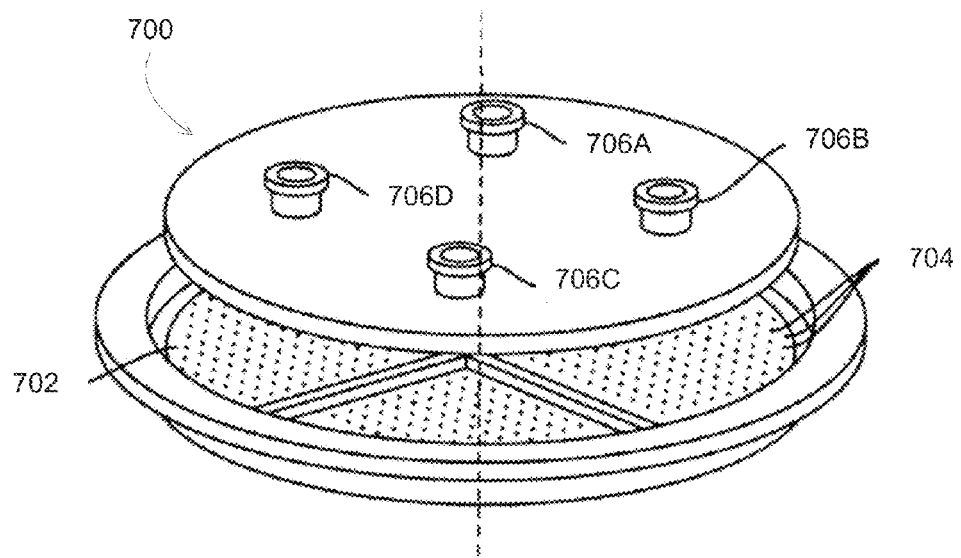
FIGS. 7A-7B illustrate examples of a large and small area ALD or CVD showerheads used for combinatorial processing.
Figure 7B:
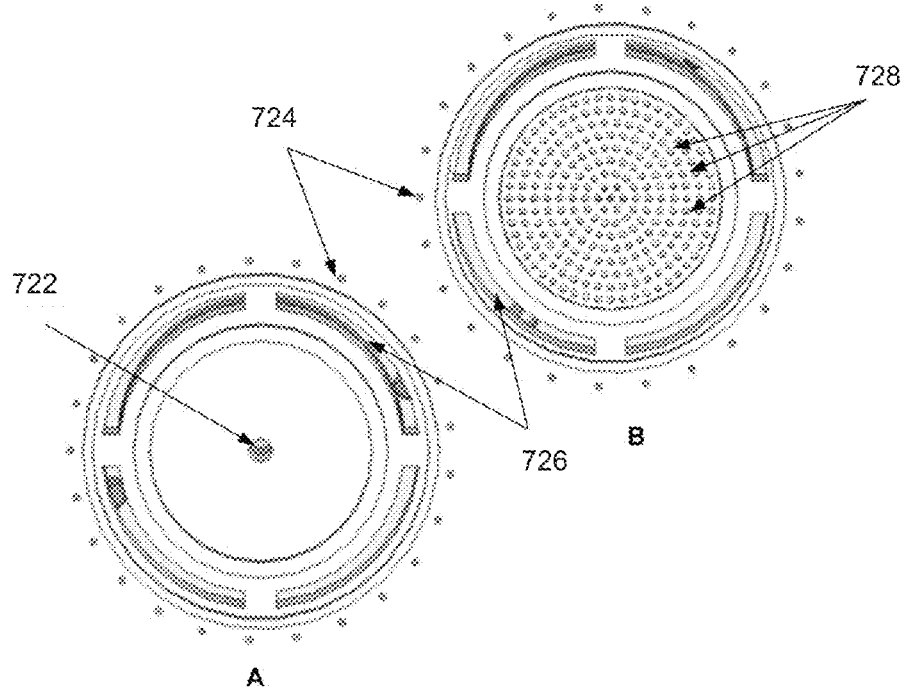

FIGS. 7A-7B illustrate examples of a large and small area ALD or CVD showerheads used for combinatorial processing. Details of large area showerhead and its use may be found in U.S. patent application Ser. No. 12/013,729 entitled "Vapor Based Combinatorial Processing" filed on Jan. 14, 2008 and claiming priority to Provisional Application No. 60/970,199 filed on Sep. 5, 2007, U.S. patent application Ser. No. 12/013,759 entitled "Vapor Based Combinatorial Processing" filed on Jan. 14, 2008 and claiming priority to Provisional Application No. 60/970,199 filed on Sep. 5, 2007, and U.S. patent application Ser. No. 12/205,578 entitled "Vapor Based Combinatorial Processing" filed on Sep. 5, 2008 which is a Continuation Application of the U.S. patent application Ser. No. 12/013,729 and claiming priority to Provisional Application No. 60/970,199 filed on Sep. 5, 2007, all of which are herein incorporated by reference. Details of small area showerhead and its use may be found in U.S. patent application Ser. No. 13/302,097 entitled "Combinatorial Deposition Based on a Spot Apparatus" filed on Nov. 22, 2011, and U.S. patent application Ser. No. 11/468,422 entitled "Combinatorial Approach for Screening of ALD Film Stacks" filed on Nov. 22, 2011, all of which are herein incorporated by reference.

The large area ALD or CVD showerhead, 700, illustrated in FIG. 7A comprises four regions, 702, used to deposit materials on a substrate. As an example, in the case of a round substrate, four different materials and/or process conditions could be used to deposit materials in each of the four quadrants of the substrate (not shown). Precursor gases, reactant gases, purge gases, etc. are introduced into each of the four regions of the showerhead through gas inlet conduits 706a-706b. For simplicity, the four regions, 702, of showerhead, 700, have been illustrated as being a single chamber. Those skilled in the art will understand that each region, 702, of showerhead, 700, may be designed to have two or more isolated gas distribution systems so that multiple reactive gases may be kept separated until they react at the substrate surface. Also for simplicity, on a single gas inlet conduit, 706a-706d, is illustrated for each of the four regions. Those skilled in the art will understand that each region, 702, of showerhead, 700, may have multiple gas inlet conduits. The gases exit each region, 702, of showerhead, 700, through holes, 704, in the bottom of the showerhead. The gases then travel to the substrate surface and react at the surface to deposit a material, etch an existing material on the surface, clean contaminants found on the surface, react with the surface to modify the surface in some way, etc. The showerhead illustrated in FIG. 7A is operable to be used with any of a CVD, PECVD, ALD, or PEALD technology.

As discussed previously, showerhead, 700, in FIG. 7A results in a deposition (or other process type) on a relatively large region of the substrate. In this example, a quadrant of the substrate. To address the limitations of the combinatorial showerhead illustrated in FIG. 7A, small spot showerheads have been designed as illustrated in FIG. 7B. FIG. 7B illustrates a bottom view of two examples of a small spot showerhead apparatus in accordance with some embodiments. The small spot showerhead configuration, A, illustrated in FIG. 7B comprises a single gas distribution port, 722, in the center of the showerhead for delivering reactive gases to the surface of the substrate. The small size of the small spot showerhead and the behavior of the technologies envisioned to use this showerhead ensure that the uniformity of the process on the substrate is adequate using the single gas distribution port. However, the small spot showerhead configuration, B, illustrated in FIG. 7B comprises a plurality of gas distribution ports, 728, for delivering reactive gases to the surface of the substrate. This configuration can be used to improve the uniformity of the process on the substrate if required.

Each small spot showerhead is surrounded by a plurality of purge holes, 724. The purge holes introduce inert purge gases (i.e. Ar, $N_2$, etc.) around the periphery of each small spot showerhead to insure that the regions under each showerhead can be processed in a site isolated manner. The gases, both the reactive gases and the purge gases, are exhausted from the process chamber through exhaust channels, 726, that surround each of the showerheads. The combination of the purge holes, 724, and the exhaust channels, 726, ensure that each region under each showerhead can be processed in a site isolated manner. The diameter of the small spot showerhead (i.e. the diameter of the purge ring) can vary between about 40 mm and about 100 mm. Advantageously, the diameter of the small spot showerhead is about 65 mm.

Using a plurality of small spot showerheads as illustrated in FIG. 7B allows a substrate to be processed in a combinatorial manner wherein different parameters can be varied as discussed above. Examples of the parameters comprise process material composition, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, etc.

Figure 8:
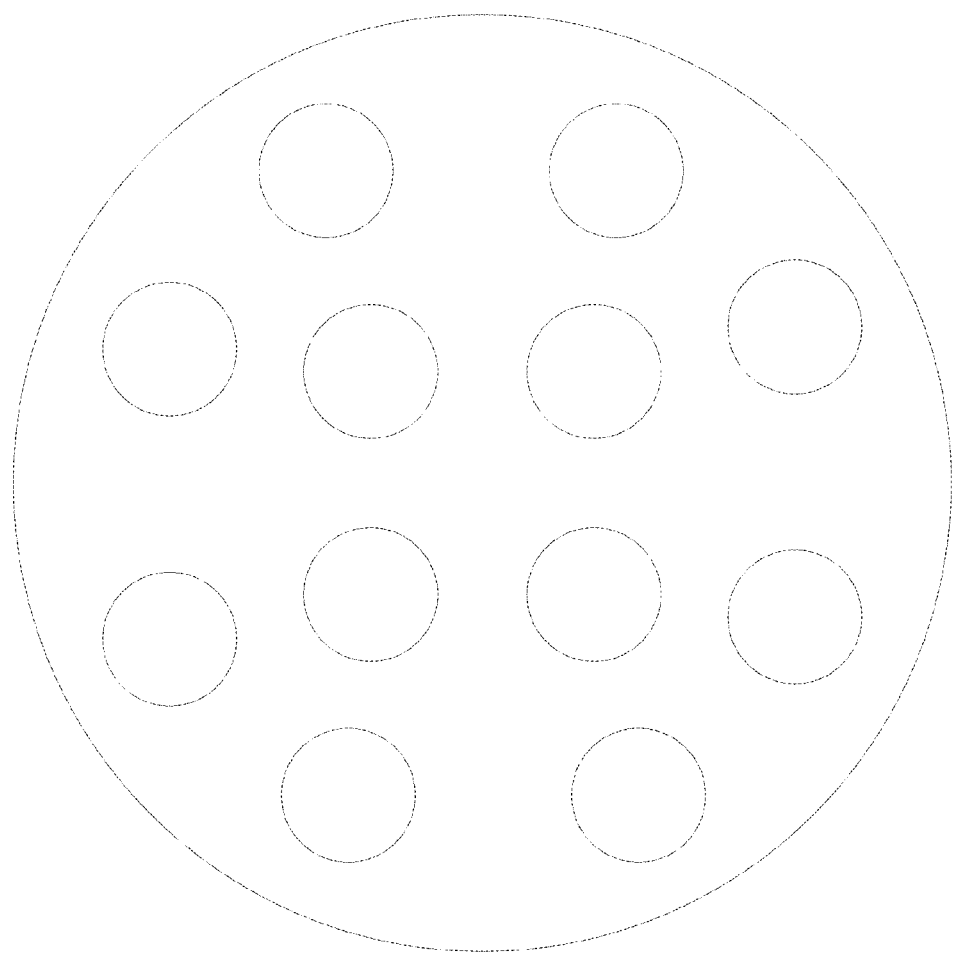
FIG. 8 illustrates one example of a pattern of site isolated regions that can be processed using a small spot showerhead apparatus in accordance with some embodiments.

FIG. 8 illustrates one example of a pattern of site isolated regions that can be processed using a small spot showerhead apparatus in accordance with some embodiments. In FIG. 8, the substrate is still generally divided into four quadrants and within each quadrant, three site isolated regions can be processed using small spot showerheads as illustrated in FIG. 7B, yielding twelve site isolated regions on the substrate. Therefore, in this example, twelve independent experiments could be performed on a single substrate.

In some embodiments, methods for forming layers, such as dielectric layers, having different compositions or different composition percentages, are disclosed, using a combination of ALD and PVD processes. The layers can be evaluated, for example, by measuring the characteristics of the layers, to determine an optimum composition or composition percentage for semiconductor device.

In some embodiments, a majority of the elements in the layers are provided by the ALD process. A minor constituent of the layers can be provided by the PVD process. For example, a base layer can be deposited by an ALD process, and one or two dopants, with minor composition percentage, e.g., less than 50 at % of the layers, can be deposited by a PVD process. As an illustrative example, a hafnium oxide layer can be deposited by an ALD process, using a hafnium-containing precursor and an oxygen-containing precursor. The hafnium oxide layer can be doped, e.g., dopants can be introduced to the hafnium layer, with silicon by a PVD process, e.g., depositing a silicon-containing layer on or within the layer of ALD hafnium oxide.

In addition to the development of a layer with desired characteristics, e.g., using the combinatorial methods, using ALD processes to form the base layer can significantly facilitate the development of an ALD process that can provide the doped base layer. The majority of the precursors to form the base layer is already available. The characteristics of the base layer deposited by ALD process have been characterized. Thus the introduction of a new ALD precursor to provide the necessary dopants for the base layer can be developed and evaluated without much deviations from the ALD base layer properties.

Advanced semiconductor devices can employ novel materials such as metal gate electrodes and high-k dielectrics. Typically high-k dielectric materials include aluminum oxide, hafnium oxide, zirconium oxide, tantalum oxide, titanium oxide, or their alloys such as hafnium silicon oxide or zirconium silicon oxide. Metal gate materials typically comprise a refractive metal or a nitride of a refractive metal, such as titanium nitride, titanium aluminum nitride, or titanium lanthanum nitride. Different combinations of high-k dielectric and metal electrode materials, together with different process conditions, can exhibit different device characteristics, such as different effective k values or different effective work function values, and thus can require careful screening and evaluations to obtain proper materials and process conditions. Combinatorial methods can be used to evaluate the materials to identify suitable candidate for advanced semiconductor devices.

In some embodiments, methods to form various semiconductor layers using a combination of an ALD process together with another process, such as PVD, are disclosed. For example, one or more layers can be deposited using a sequential deposition of ALD and PVD processes. The layers can be deposited using different process conditions and/or material compositions. The layers can be characterized, for example, to identify materials, material compositions, or process conditions that is best suitable for a particular semiconductor device or device fabrication. In some embodiments, an all ALD process can then be developed, providing an ALD layer with similar characteristics as the layer using the sequential deposition processes.

Figure 9A:
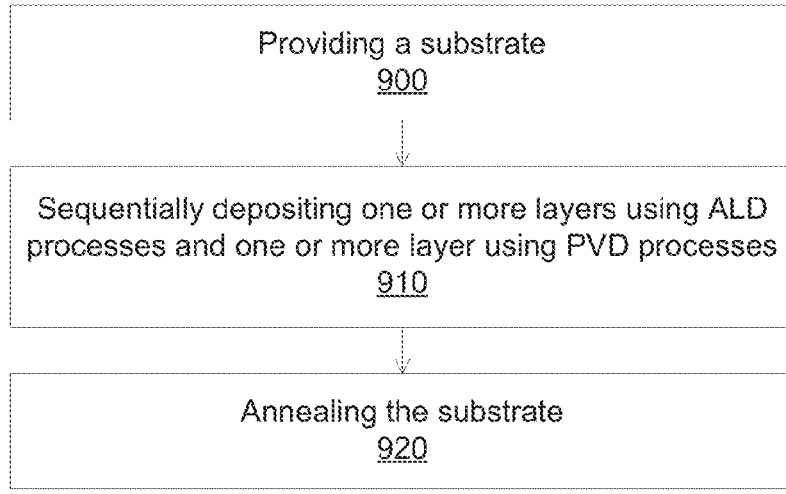
FIGS. 9A-9B illustrate flowcharts for screening deposited layers according to some embodiments.
Figure 9B:
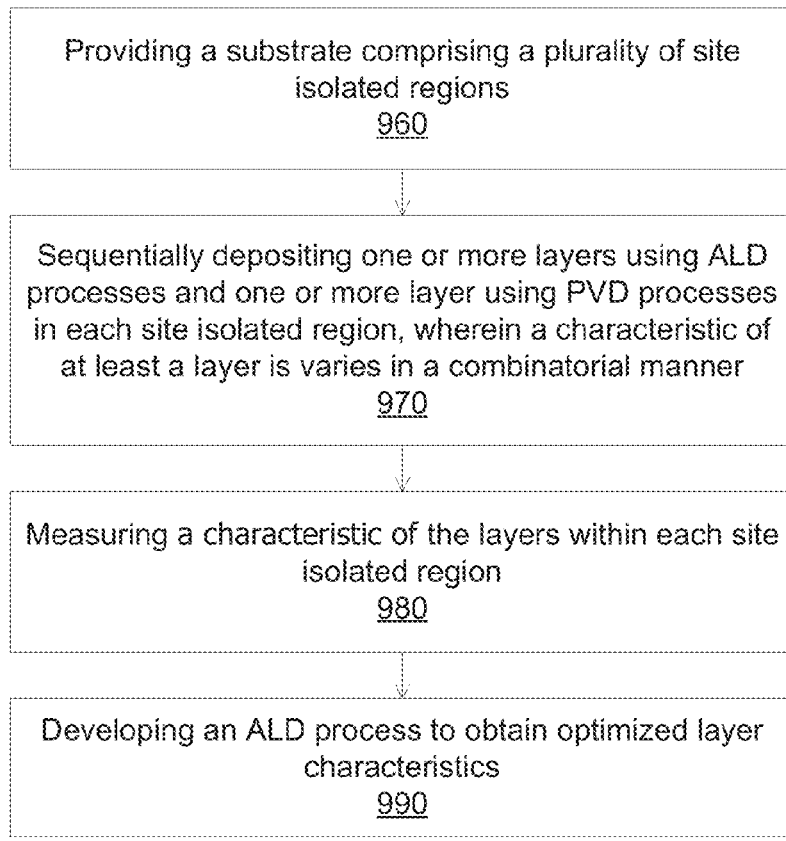

FIGS. 9A-9B illustrate flowcharts for screening deposited layers according to some embodiments. Different high-k dielectric materials, different metal materials, and/or different process conditions using a combination of PVD and ALD deposition for the layers can be used to fabricate the layers, including metal-oxide-semiconductor (MOS) or metal-insulator-metal (MIM) capacitor structures, representing gate stacks or memory stacks of a semiconductor device. The material characteristics and the electrical performance of the layers and the capacitor devices can provide the properties of the layers, permitting a quick ranking of various materials and process conditions. Poor performance combinations, together with sub-optimum process conditions can be identified and removed without the need to fabricate and test fully-operational devices.

In FIG. 9A, a substrate is provided in operation 900. The substrate can be a silicon-containing substrate, a germanium-containing substrate, an III-V or II-VI substrate, or any other substrates, such as a substrate having a conductive layer formed thereon. In operation 910, one or more ALD layers and one or more PVD layers are sequentially deposited on the substrate. For example, a first layer can be deposited by an ALD process, followed by a second layer deposited by a PVD process. Alternatively, a first layer can be deposited by an ALD process, followed by a second layer deposited by a PVD process, and followed by a third layer deposited by an ALD process, such as the ALD process used to deposit the first layer.

The ALD layers can include a high-k dielectric material, such as aluminum oxide, hafnium oxide, zirconium oxide, tantalum oxide, titanium oxide. The PVD layers can include a different material, used to modify the composition of the ALD layer. The PVD layers can include a layer of silicon, for example, for hafnium oxide, zirconium oxide ALD layers, and a layer of hafnium or zirconium, for example, for tantalum oxide, titanium oxide ALD layers.

In operation 920, the layers are annealed, e.g., by a rapid thermal process, a plasma annealing process, or a reactive anneal process. For example, the substrate can be exposed to a high temperature ambient, an ambient containing reactive species, or a plasma ambient.

In some embodiments, multiple site isolation regions are processed on a substrate, with varying materials and process conditions for the different site isolated regions. In some embodiments, structural layers or patterned device structures can be fabricated, including lithographically defined active areas, and lithographically defined metal electrodes, aligned with the active areas.

FIG. 9B illustrates a flowchart for screening layers, including layer materials and compositions, according to some embodiments. The layers can include structural layers or capacitor structures with dielectric layers and metal electrodes, fabricated using shadow masks or a photolithography process. The screening process can include structural and electrical characteristics of the layers and devices to allow the evaluation of the feasibility of different materials and processes.

In operation 960, a semiconductor substrate is provided. The substrate can have multiple site isolated regions defined thereon. For example, a site isolated processing can be performed on the substrate, generating regions on the substrate that are isolated from each other. Alternatively, the site isolated regions can be defined in a subsequent process, for example, in a PVD deposition process that deposits a layer of material on the substrate in multiple separated regions. A characteristic of the deposition or the deposited layer can be varied in a combinatorial manner.

In operation 970, a sequence of deposition can be performed in each site isolated region. The sequence of deposition can include ALD and PVD processes, such as an ALD process, followed by a PVD process, and ended with an ALD process. The sequence of deposition can be performed in a combinatorial manner, e.g., at least a characteristic of a deposition process or of a layer is varied in a combinatorial manner. Optional processing steps can be added, such as a rapid thermal anneal or a plasma anneal after the sequential deposition. In some embodiments, test devices can be fabricated, such as capacitor or transistor structures.

In operation 980, the layers can be characterized according to each site isolated regions. The characterization can include structural characterization, such as interface bonding, amorphous layer or polycrystalline layer. The characterization can include electrical characterization, such as a flatband voltage measurement, for example, to determine the presence of charges in the dielectric and at the dielectric/semiconductor interface. The electrical tests can comprise I-V and C-V measurements, including single curve or cycling testing, with varying sweep voltage range, sweep speed, or sweep frequency, which can offer possible correlation to the defect states.

The data related to the performance of the layers or devices can be extracted from the characterization. For example, k values or reliability data for a high-k dielectric layer can be extracted from the electrical tests. The optimum layers, including materials and process conditions can be selected based on a comparison of the device performance.

In operation 990, an ALD process can be optionally developed to generate the selected layers having the optimum characteristics. Since the layers are deposited having a major ALD portion, the development of an all ALD process can be facilitated.

In some embodiments, methods for screening materials for ALD process developments are provided. The screening process can include varying a PVD deposition characteristic in a combinatorial manner for an ALD base layer. After the screening process is completed, an all ALD process can be developed to provide the layer with the suitable characteristics.

Figure 10:
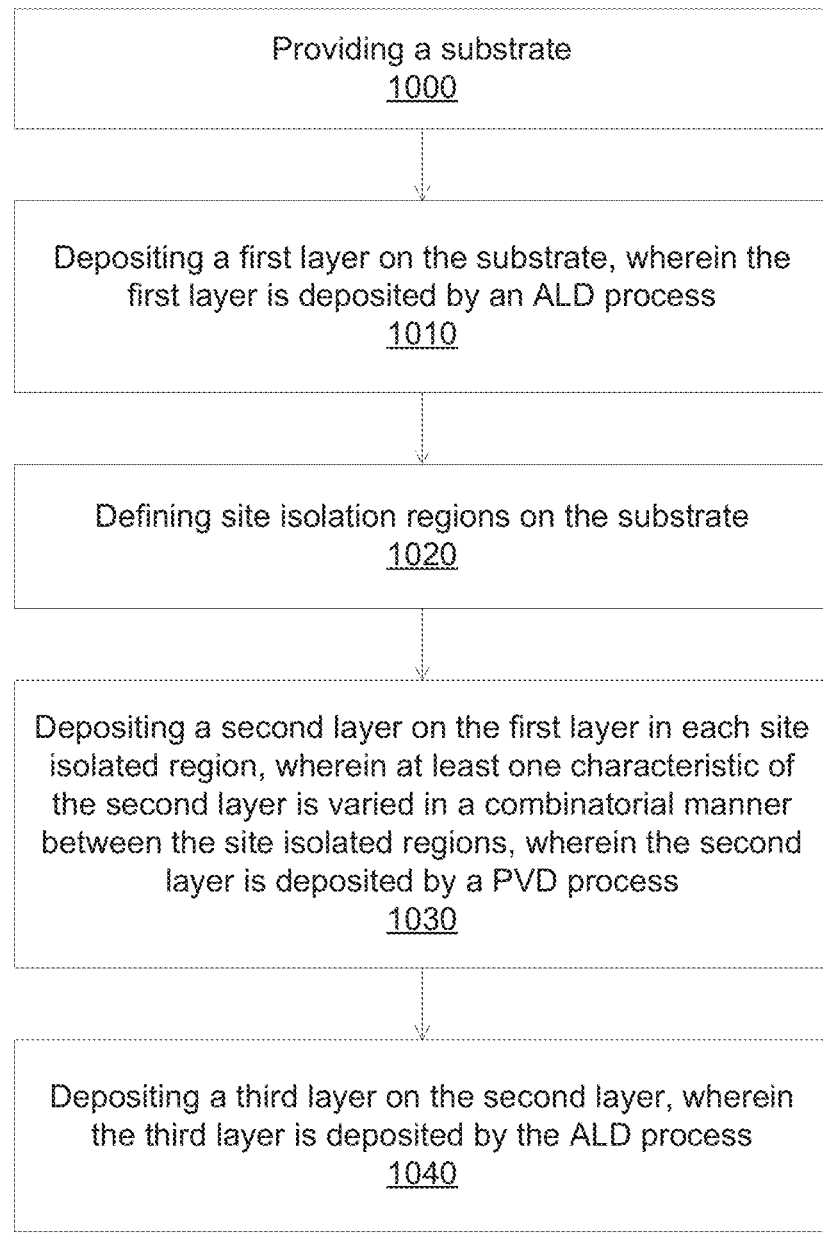
FIG. 10 illustrates a flowchart for screening layers according to some embodiments.

FIG. 10 illustrates a flowchart for screening layers according to some embodiments. In operation 1000, a substrate is provided. Other processes can be performed on the substrate, such as a cleaning process, a bottom electrode deposition for capacitor structure fabrication, or a device isolation together with source/drain for transistor device fabrication.

In operation 1010, a first layer can be deposited on the substrate. The first layer can be deposited using a first ALD process. The first ALD process can include a sequential exposure of multiple precursors. For example, an aluminum oxide layer can be deposited by an ALD process, using an aluminum-containing precursor of trimethyl aluminum together with an oxygen-containing precursor of water. The ALD process can be deposited on the whole substrate. In some embodiments, the first layer can be a dielectric layer. The ALD process for depositing the first layer can include between 5 to 20 ALD cycles. The thickness of the first layer can be between 2 and 10 nm.

In operation 1020, site isolation regions are defined on the substrate. The site isolation regions can be physically defined, for example, by forming a dielectric isolation region between different regions of the substrate. The site isolation regions can be defined by a subsequent deposition process that forms different regions that are isolated from each other. In operation 1030, a second layer can be deposited on the first layer in each site isolated region. The second layer can be deposited using a PVD process. The thickness of the second layer can be between 0.5 and 10 nm, or can be between 0.05 and 10 nm, including less than 1 monolayer. The second layer can include an element different from the elements of the first layer deposited by the ALD process. The PVD layer can be used to dope the ALD layer, e.g., providing a mixture or an alloy with the ALD layer.

In some embodiments, at least one characteristic of the second layer, or the PVD process that is used to deposit the second layer, can be varied in a combinatorial manner between the site isolated regions. The characteristics can include the thickness of the PVD layer, the composition of the PVD layer, different targets for the PVD process, or different deposition conditions, e.g., deposition time or deposition temperature, of the PVD process. For example, a thickness of the PVD layer in one site isolated region can be 1 nm, and a thickness of the PVD layer in another site isolated region can be 2 nm.

In operation 1040, a third layer can be deposited on the second layer. The third layer can be deposited using a second ALD process. The second ALD process can be the same or different from the first ALD process. For example, the precursors of the second ALD process can be different from the precursor of the first ALD process. Alternatively, the precursors for the first and second ALD processes can be the same, but the layers can be deposited using different ALD process conditions, such as different deposition temperatures or times. The ALD process can be deposited on the whole substrate. In some embodiments, the third layer can be a dielectric layer. The ALD process for depositing the third layer can include between 5 to 20 ALD cycles. The thickness of the third layer can be between 2 and 10 nm.

In some embodiments, methods to screening materials for ALD process developments are provided. The screening process can include varying an ALD deposition characteristic in a combinatorial manner to form an ALD base layer. After the screening process is completed, an all ALD process can optionally be developed to provide the layer with the suitable characteristics.

Figure 11:
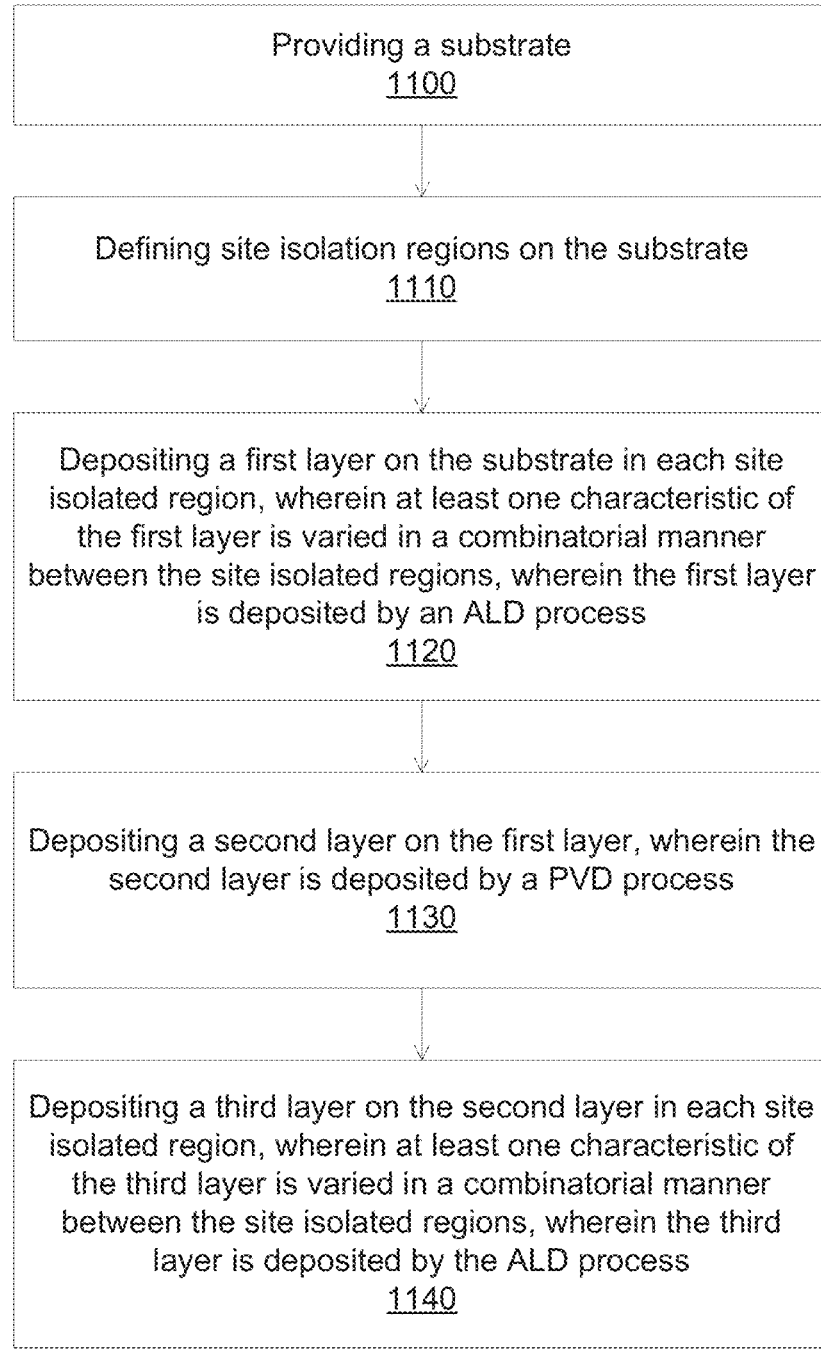
FIG. 11 illustrates a flowchart for screening layers according to some embodiments.

FIG. 11 illustrates a flowchart for screening layers according to some embodiments. In operation 1100, a substrate is provided. In operation 1110, site isolation regions can be defined on the substrate. In operation 1120, a first layer can be deposited on the substrate in each site isolated region. The first layer can be deposited using a first ALD process. The first ALD process can include a sequential exposure of multiple precursors. The ALD process can be deposited on the whole substrate. In some embodiments, the first layer can be a dielectric layer. The ALD process for depositing the first layer can include between 5 to 20 ALD cycles. The thickness of the first layer can be between 2 and 10 nm.

In some embodiments, at least one characteristic of the first layer, or the ALD process that is used to deposit the first layer, can be varied in a combinatorial manner between the site isolated regions. The characteristics can include the thickness of the ALD layer, the composition of the ALD layer, or different deposition conditions, e.g., deposition time or deposition temperature, of the ALD process.

In operation 1130, a second layer can be deposited on the first layer. The second layer can be deposited using a PVD process. The thickness of the second layer can be between 0.5 and 10 nm, or can be between 0.05 and 10 nm, including less than 1 monolayer. The second layer can include an element different from the elements of the first layer deposited by the ALD process. The PVD layer can be used to dope the ALD layer, e.g., providing a mixture or an alloy with the ALD layer. The second layer can be deposited on the whole substrate, e.g., the same second layer can be deposited on the first layers in the site isolated regions.

In operation 1140, a third layer can be deposited on the second layer in each site isolated region. The third layer can be deposited using a second ALD process. The second ALD process can be the same or different from the first ALD process. For example, the precursors of the second ALD process can be different from the precursor of the first ALD process. Alternatively, the precursors for the first and second ALD processes can be the same, but the layers can be deposited using different ALD process conditions, such as different deposition temperatures or times. The ALD process can be deposited on the whole substrate. In some embodiments, the third layer can be a dielectric layer. The ALD process for depositing the third layer can include between 5 to 20 ALD cycles. The thickness of the third layer can be between 2 and 10 nm.

In some embodiments, at least one characteristic of the third layer, or the ALD process that is used to deposit the third layer, can be varied in a combinatorial manner between the site isolated regions. The characteristics can include the thickness of the ALD layer, the composition of the ALD layer, or different deposition conditions, e.g., deposition time or deposition temperature, of the ALD process.

In some embodiments, methods to screening materials for ALD process developments are provided. The screening process can include varying an ALD deposition characteristic and a PVD deposition characteristic in a combinatorial manner to form an ALD base layer and a PVD layer. After the screening process is completed, an all ALD process can optionally be developed to provide the layer with the suitable characteristics.

Figure 12:
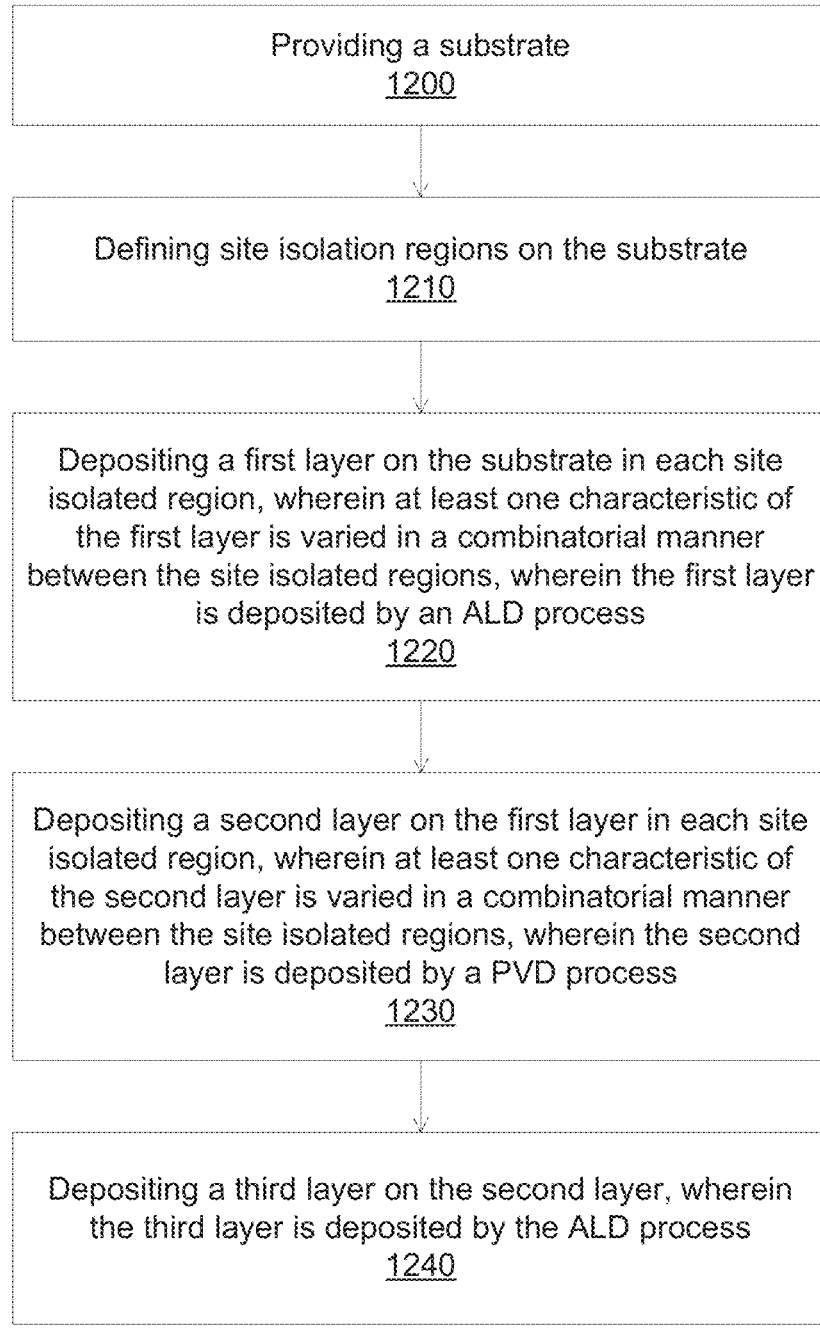
FIG. 12 illustrates a flowchart for screening layers according to some embodiments.

FIG. 12 illustrates a flowchart for screening layers according to some embodiments. In operation 1200, a substrate is provided. In operation 1210, site isolation regions can be defined on the substrate. In operation 1220, a first layer can be deposited on the substrate in each site isolated region. The first layer can be deposited using a first ALD process. The first ALD process can include a sequential exposure of multiple precursors. The ALD process can be deposited on the whole substrate. In some embodiments, the first layer can be a dielectric layer. The ALD process for depositing the first layer can include between 5 to 20 ALD cycles. The thickness of the first layer can be between 2 and 10 nm.

In some embodiments, at least one characteristic of the first layer, or the ALD process that is used to deposit the first layer, can be varied in a combinatorial manner between the site isolated regions. The characteristics can include the thickness of the ALD layer, the composition of the ALD layer, or different deposition conditions, e.g., deposition time or deposition temperature, of the ALD process.

In operation 1230, a second layer can be deposited on the first layer in each site isolated region. The second layer can be deposited using a PVD process. The thickness of the second layer can be between 0.5 and 10 nm, or can be between 0.05 and 10 nm, including less than 1 monolayer. The second layer can include an element different from the elements of the first layer deposited by the ALD process. The PVD layer can be used to dope the ALD layer, e.g., providing a mixture or an alloy with the ALD layer.

In some embodiments, at least one characteristic of the second layer, or the PVD process that is used to deposit the second layer, can be varied in a combinatorial manner between the site isolated regions. The characteristics can include the thickness of the PVD layer, the composition of the PVD layer, different targets for the PVD process, or different deposition conditions, e.g., deposition time or deposition temperature, of the PVD process. For example, a thickness of the PVD layer in one site isolated region can be 1 nm, and a thickness of the PVD layer in another site isolated region can be 2 nm.

In operation 1240, a third layer can be deposited on the second layer. The third layer can be deposited using a second ALD process. The second ALD process can be the same or different from the first ALD process. For example, the precursors of the second ALD process can be different from the precursor of the first ALD process. Alternatively, the precursors for the first and second ALD processes can be the same, but the layers can be deposited using different ALD process conditions, such as different deposition temperatures or times. The ALD process can be deposited on the whole substrate. In some embodiments, the third layer can be a dielectric layer. The ALD process for depositing the third layer can include between 5 to 20 ALD cycles. The thickness of the third layer can be between 2 and 10 nm.

Figure 13:
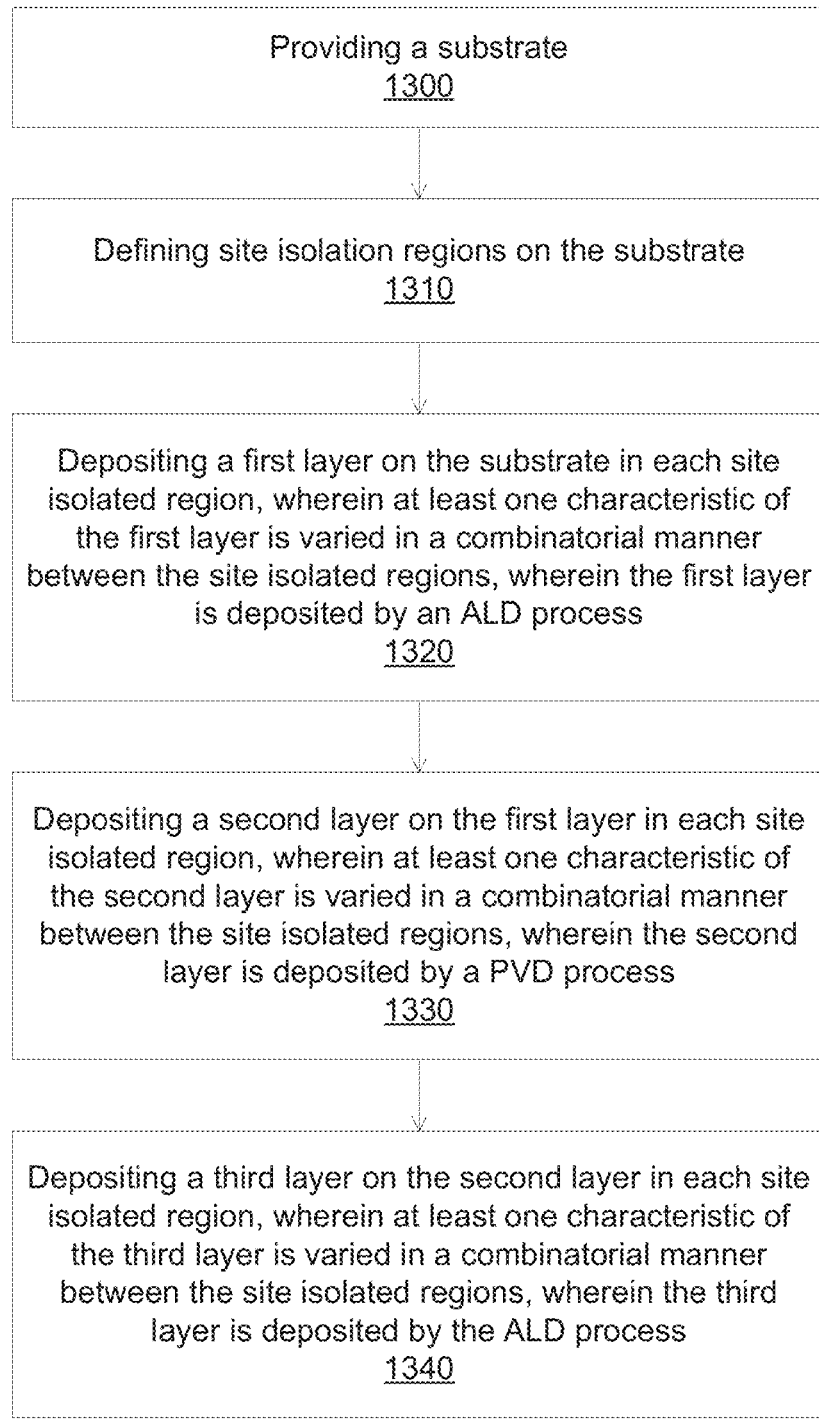
FIG. 13 illustrates a flowchart for screening layers according to some embodiments.

FIG. 13 illustrates a flowchart for screening layers according to some embodiments. In operation 1300, a substrate is provided. In operation 1310, site isolation regions can be defined on the substrate. In operation 1320, a first layer can be deposited on the substrate in each site isolated region. The first layer can be deposited using a first ALD process. The first ALD process can include a sequential exposure of multiple precursors. The ALD process can be deposited on the whole substrate. In some embodiments, the first layer can be a dielectric layer. The ALD process for depositing the first layer can include between 5 to 20 ALD cycles. The thickness of the first layer can be between 2 and 10 nm.

In some embodiments, at least one characteristic of the first layer, or the ALD process that is used to deposit the first layer, can be varied in a combinatorial manner between the site isolated regions. The characteristics can include the thickness of the ALD layer, the composition of the ALD layer, or different deposition conditions, e.g., deposition time or deposition temperature, of the ALD process.

In operation 1330, a second layer can be deposited on the first layer in each site isolated region. The second layer can be deposited using a PVD process. The thickness of the second layer can be between 0.5 and 10 nm, or can be between 0.05 and 10 nm, including less than 1 monolayer. The second layer can include an element different from the elements of the first layer deposited by the ALD process. The PVD layer can be used to dope the ALD layer, e.g., providing a mixture or an alloy with the ALD layer.

In some embodiments, at least one characteristic of the second layer, or the PVD process that is used to deposit the second layer, can be varied in a combinatorial manner between the site isolated regions. The characteristics can include the thickness of the PVD layer, the composition of the PVD layer, different targets for the PVD process, or different deposition conditions, e.g., deposition time or deposition temperature, of the PVD process. For example, a thickness of the PVD layer in one site isolated region can be 1 nm, and a thickness of the PVD layer in another site isolated region can be 2 nm.

In operation 1340, a third layer can be deposited on the second layer in each site isolated region. The third layer can be deposited using a second ALD process. The second ALD process can be the same or different from the first ALD process. For example, the precursors of the second ALD process can be different from the precursor of the first ALD process. Alternatively, the precursors for the first and second ALD processes can be the same, but the layers can be deposited using different ALD process conditions, such as different deposition temperatures or times. The ALD process can be deposited on the whole substrate. In some embodiments, the third layer can be a dielectric layer. The ALD process for depositing the third layer can include between 5 to 20 ALD cycles. The thickness of the third layer can be between 2 and 10 nm.

In some embodiments, at least one characteristic of the third layer, or the ALD process that is used to deposit the third layer, can be varied in a combinatorial manner between the site isolated regions. The characteristics can include the thickness of the ALD layer, the composition of the ALD layer, or different deposition conditions, e.g., deposition time or deposition temperature, of the ALD process.

Figure 14A:
FIGS. 14A-14D illustrate illustrative cross sections of a fabrication sequence of a multilayer according to some embodiments.
Figure 14B:
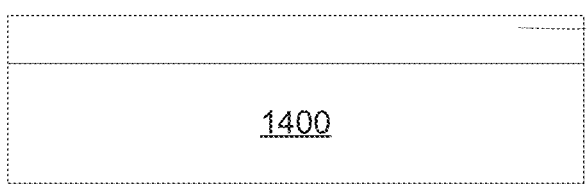
Figure 14C:
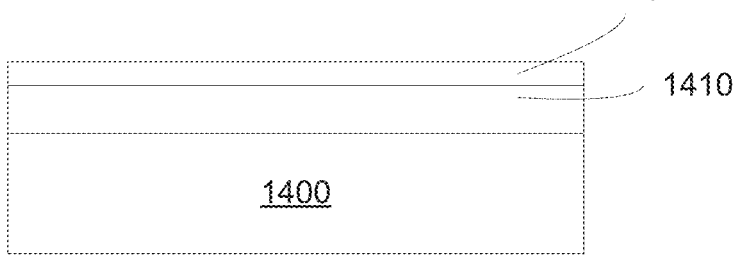
Figure 14D:
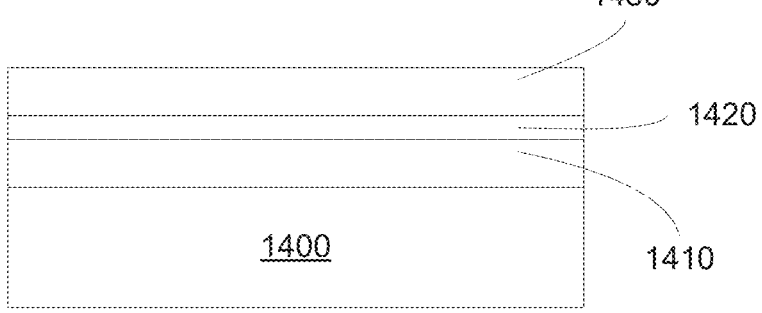

FIGS. 14A-14D illustrate illustrative cross sections of a fabrication sequence of a multilayer according to some embodiments. In FIG. 14A, a substrate 1400 is provided. In FIG. 14B, a first layer 1410 is deposited on the substrate by an ALD process. In FIG. 14C, a second layer 1420 is deposited on the first layer 1410 by a PVD process. In FIG. 14D, a third layer 1430 is deposited on the second layer by an ALD process. An optional anneal process can be used, such as a thermal anneal, a reactive anneal with a reactive species, or a plasma anneal.

As shown, the multilayer includes three layers, deposited by a first ALD process, followed by a PVD process, and ended with a second ALD process. Other sequences can be used, such as by a first PVD process, followed by an ALD process, followed and a second PVD process. Other multilayer structures can be used, such as a multilayer having two layers, deposited by an ALD process followed by a PVD process or deposited by a PVD process followed by an ALD process. The multilayer can have other number of layers, such as four, five or six layers.

Figure 15A:
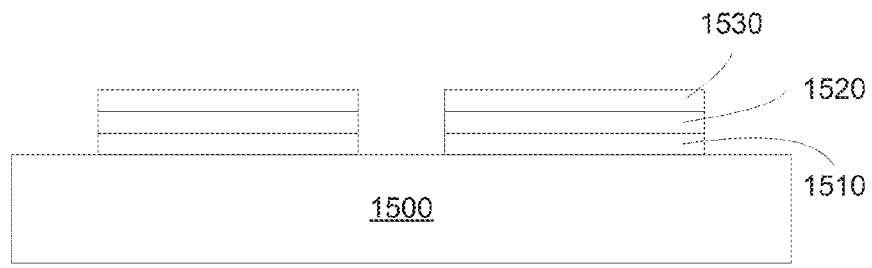
FIGS. 15A-15C illustrates an example of substrates having multiple site isolated regions containing different structures fabricated thereon according to some embodiments.
Figure 15B:
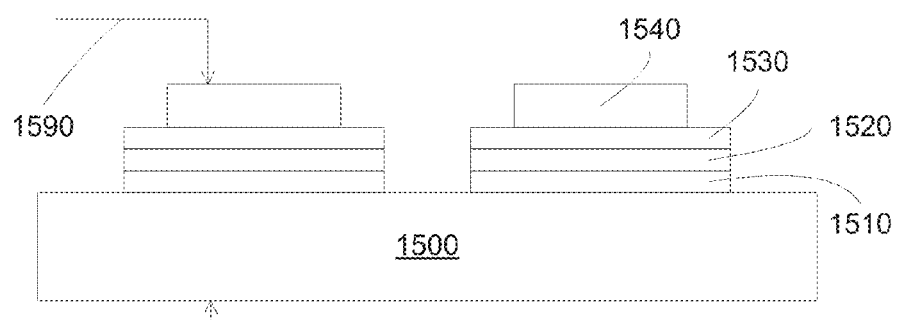
Figure 15C:
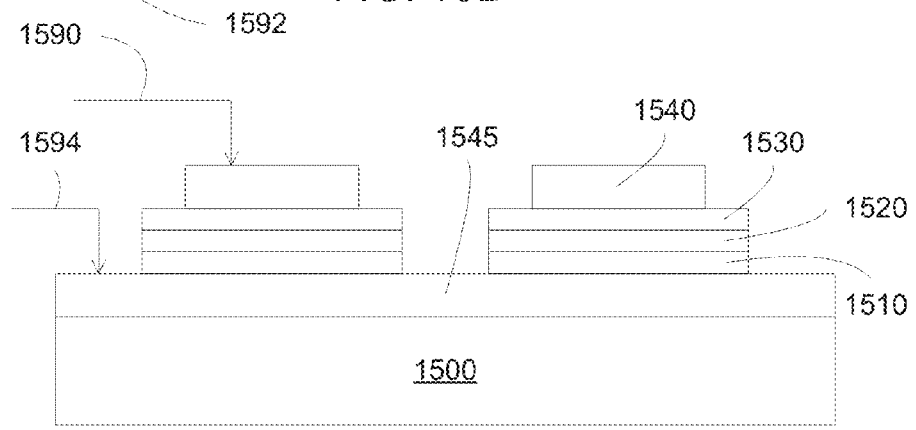

FIGS. 15A-15C illustrates an example of substrates having multiple site isolated regions containing different structures fabricated thereon according to some embodiments. In FIG. 15A, multiple multilayers are fabricated in different site isolated regions on the substrate 1500. Each site isolated region can include a multilayer having a first layer 1510, a second layer 1520, and a third layer 1530. Other multilayer structures can also be used, such as having two layers or 4-6 layers.

In FIG. 15B, MOS capacitor structures can be fabricated on a semiconductor substrate in different site isolated region. Each site isolated region can include a multilayer having a first layer 1510, a second layer 1520, and a third layer 1530, together with a top electrode 1540. The MOS capacitor structures can be electrically tested, for example, by a top probe 1590 coupled to the top electrode, and a bottom probe 1592 coupled to the substrate 1500.

In FIG. 15C, MIM capacitor structures can be fabricated on a semiconductor substrate in different site isolated region. Each site isolated region can include a multilayer having a first layer 1510, a second layer 1520, and a third layer 1530, together with a top and bottom electrodes 1540 and 1545. The MIM capacitor structures can be electrically tested, for example, by a top probe 1590 coupled to the top electrode, and a bottom probe 1594 coupled to the bottom electrode 1545.

In some embodiments, the present invention discloses combinatorial workflow for evaluating material compositions for a multilayer stack, to provide optimized materials and compositions for an ALD process. High productivity combinatorial processing can be a fast and economical technique for electrically screening materials and process conditions to determine their suitability and possible side effects on the device performance, avoiding potentially costly device process development through proper selection of materials and processes.

Figure 16:
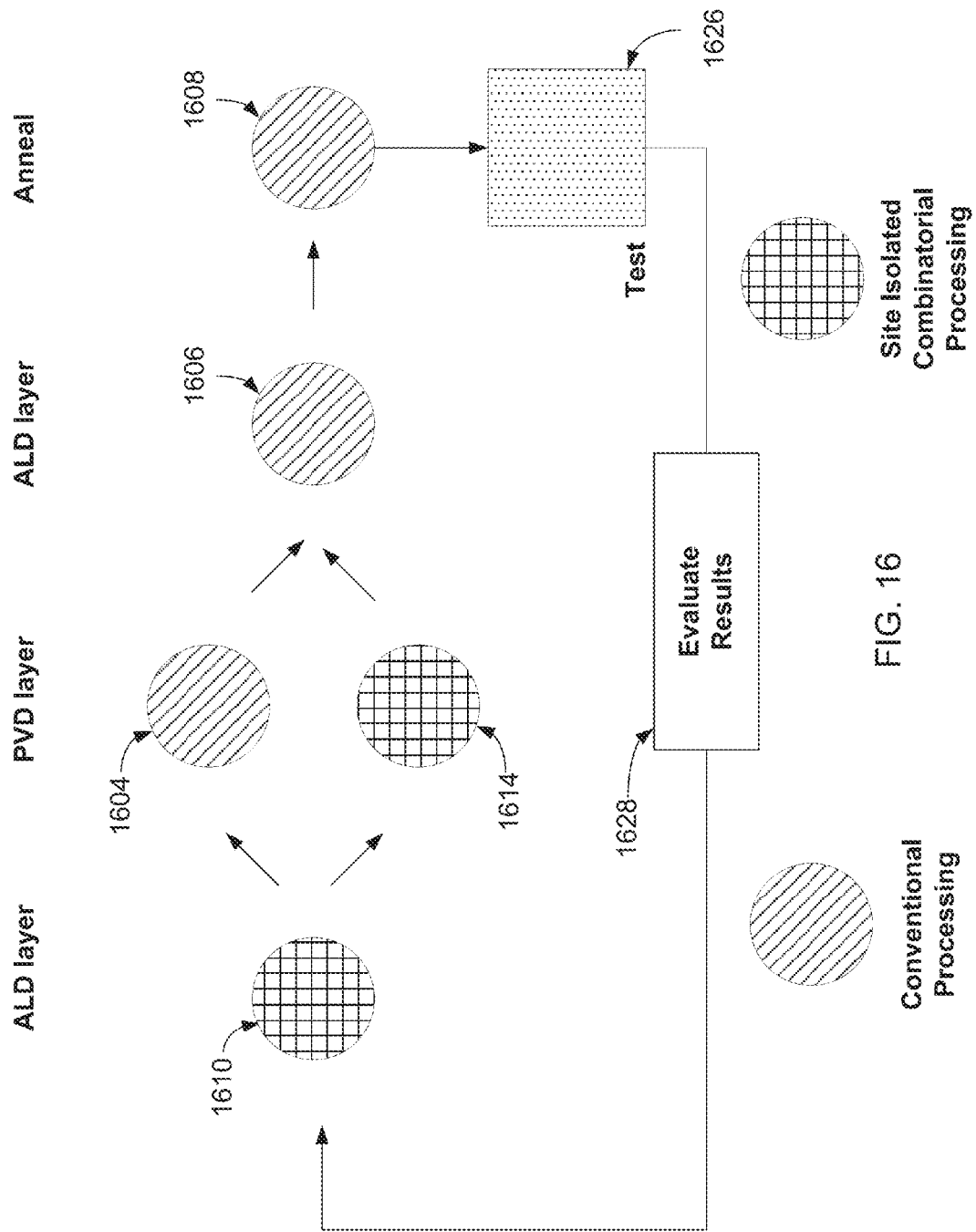
FIG. 16 illustrates a flow diagram for forming simple test structures according to some embodiments.

FIG. 16 illustrates a flow diagram for forming simple test structures according to some embodiments. As discussed in relation to FIG. 2, several of the layers or process steps provide opportunities to apply combinatorial techniques to the development and investigation of the materials and treatments for the layers. For evaluating layer properties, for example, to develop an ALD process, parameter candidates include the ALD process and the PVD process. As mentioned previously, examples of suitable process includes a sequence of ALD and PVD processes. The ALD and PVD processes can be performed using different precursors, targets, materials, compositions, and process conditions. These are meant to be illustrative parameters and those skilled in the art will be able to apply HPC techniques to any of the commonly used process parameters.

A process step that may be investigated using HPC techniques includes the PVD process. The PVD process can be designed to facilitate the incorporation, e.g., doping, of materials to a base ALD layer. The PVD process conditions may be provided using HPC techniques by varying process parameters such as targets, reactive gases, or deposition conditions such as temperature or time.

Another process step that may be investigated using HPC techniques includes the ALD process. The ALD process can be designed to facilitate the formation of a base ALD layer. The ALD process conditions may be provided using HPC techniques by varying process parameters such as the base layer composition, precursors, or deposition conditions such as temperature or time.

Returning to FIG. 16, through the use of a combination of conventional and combinatorial processing systems (i.e. systems capable of processing multiple isolated regions on a single substrate) a number of trajectories through the various systems illustrated in the flow diagram of FIG. 16 can be envisioned. In FIG. 16, a first layer can be deposited using an ALD process in a conventional processing manner, 1610, in some embodiments where the ALD process is not a variable. A second layer can be deposited using a PVD process in a combinatorial processing manner, 1614. As discussed previously, the second layer may be formed in a conventional processing manner, 1604, or in a site isolated combinatorial processing manner, 1614. A third layer may be deposited in a conventional processing manner, 1606, in some embodiments where the metal electrode is not a variable. An anneal process, such as a post metallization anneal in forming gas, may be processed in a conventional processing manner, 1608. After the deposition of the various layers and subsequent processing, the various MOS capacitor devices represented by each of the site isolated regions may be testing in step 1626, and the results evaluated in step, 1628. As discussed previously, the results will form the basis for additional cycles of investigation through HPC techniques to identify materials and process conditions that evaluate the suitability of photoresist strip exposure in devices having the given high-k dielectric and metal gate electrode.

Using the simple diagram in FIG. 16, there are two possible trajectories through the process sequence, which encompass all of the possible combinations of conventional and combinatorial processing illustrated. Those skilled in the art will understand that HPC techniques may be applied to other processes not illustrated such as anneal treatments, cleaning, etching, rinsing, surface treatments, surface functionalization, etc. As more variable process steps are included, the total number of required experiments increases dramatically. This illustrates the benefits of using HPC techniques to limit the number of substrates to a manageable number and minimize the cost of the development program.

The illustrated simple diagram represents a possible evaluation process for the effects of various materials and processes of the PVD process on a specific ALD base layer. The variables further include other process windows, such as the deposition temperature, and time.

Figure 17:
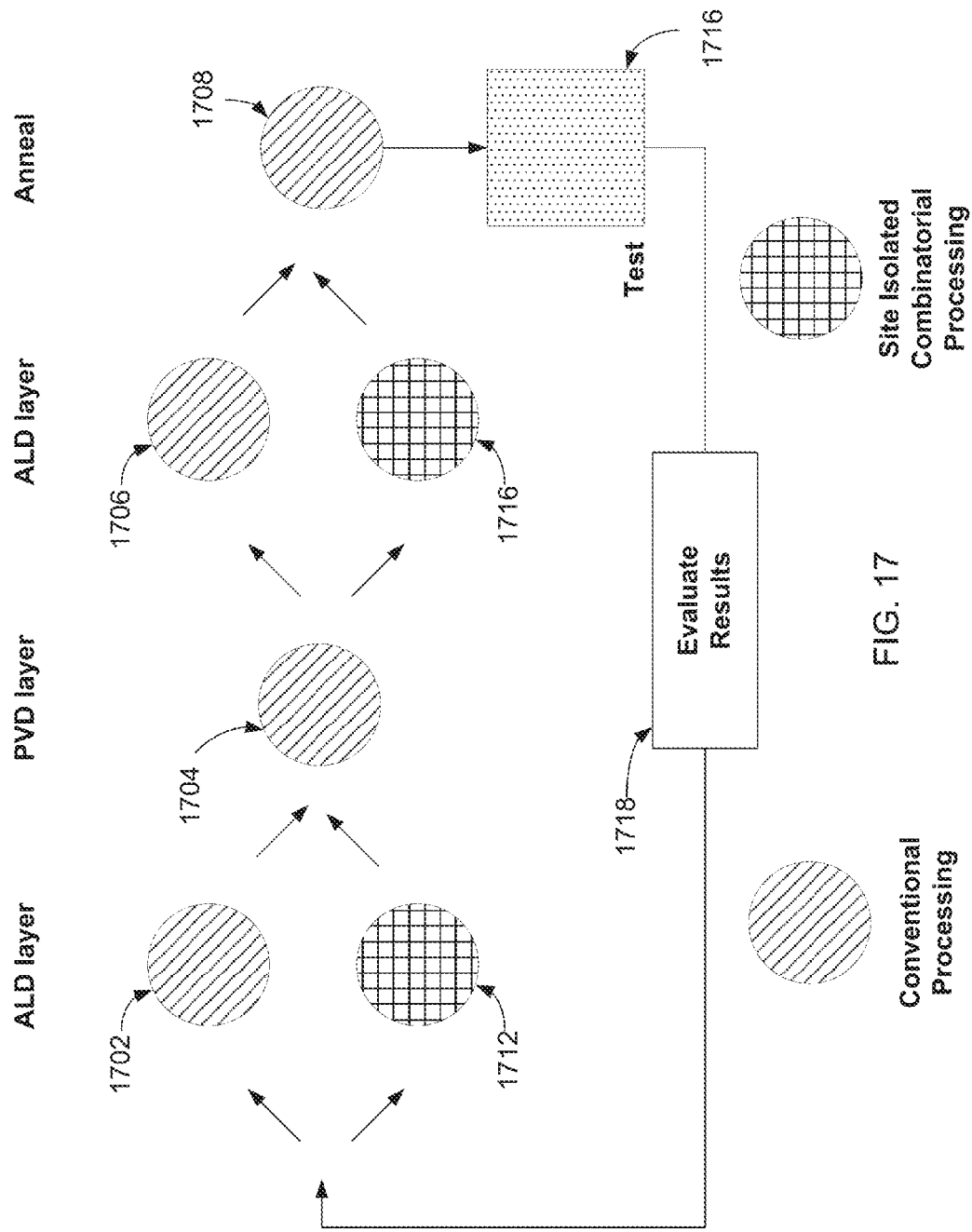
FIG. 17 illustrates a flow diagram for forming another test structure evaluation according to some embodiments.

FIG. 17 illustrates a flow diagram for forming another test structure evaluation according to some embodiments. Different evaluation schemes can be included in the test methodology, including the ALD or PVD process conditions. Through the use of a combination of conventional and combinatorial processing systems (i.e. systems capable of processing multiple isolated regions on a single substrate) a number of trajectories through the various systems illustrated in the flow diagram of FIG. 17 can be envisioned. In FIG. 17, the first ALD layer may be deposited in a combinatorial processing manner, 1712. As discussed previously, the first ALD layer may be formed in a conventional processing manner, 1702, or in a site isolated combinatorial processing manner, 1712. The PVD layer may be deposited in a conventional processing manner, 1704, in some embodiments where the PVD layer is not a variable. The second ALD layer may be deposited in a combinatorial processing manner, 1716. As discussed previously, the second ALD layer may be formed in a conventional processing manner, 1706, or in a site isolated combinatorial processing manner, 1716. The anneal process, such as a post metallization anneal in forming gas, may be processed in a conventional processing manner, 1708. After the deposition of the various layers and subsequent processing, the various MOS capacitor devices represented by each of the site isolated regions may be testing in step 1726, and the results evaluated in step, 1728. As discussed previously, the results will form the basis for additional cycles of investigation through HPC techniques to identify materials and process conditions that evaluate the suitability of photoresist strip exposure with respect to different metal gate electrode in devices having the given high-k dielectric.

Using the simple diagram in FIG. 17, there are four possible trajectories through the process sequence. These four trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Figure 18:
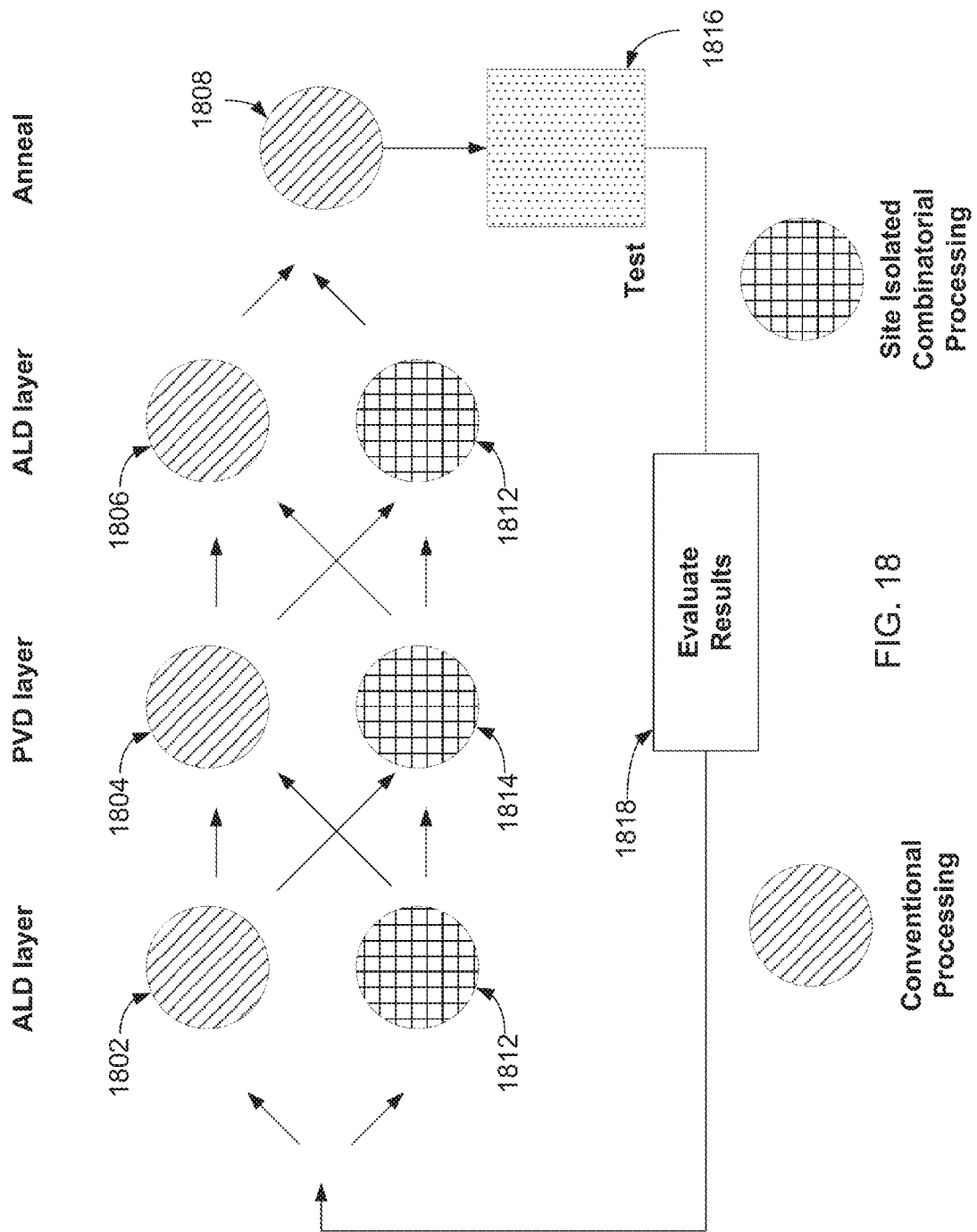
FIG. 18 illustrates a flow diagram for forming another test structure evaluation according to some embodiments.

FIG. 18 illustrates a flow diagram for forming another test structure evaluation according to some embodiments. Different evaluation schemes can be included in the test methodology, including the ALD or PVD process conditions. Through the use of a combination of conventional and combinatorial processing systems (i.e. systems capable of processing multiple isolated regions on a single substrate) a number of trajectories through the various systems illustrated in the flow diagram of FIG. 18 can be envisioned. In FIG. 18, the first ALD layer may be deposited in a combinatorial processing manner, 1812. As discussed previously, the first ALD layer may be formed in a conventional processing manner, 1802, or in a site isolated combinatorial processing manner, 1812. The PVD layer may be deposited in a combinatorial processing manner, 1814. As discussed previously, the PVD layer may be formed in a conventional processing manner, 1804, or in a site isolated combinatorial processing manner, 1814. The second ALD layer may be deposited in a combinatorial processing manner, 1816. As discussed previously, the second ALD layer may be formed in a conventional processing manner, 1806, or in a site isolated combinatorial processing manner, 1816. The anneal process, such as a post metallization anneal in forming gas, may be processed in a conventional processing manner, 1808. After the deposition of the various layers and subsequent processing, the various MOS capacitor devices represented by each of the site isolated regions may be testing in step 1826, and the results evaluated in step, 1828. As discussed previously, the results will form the basis for additional cycles of investigation through HPC techniques to identify materials and process conditions that evaluate the suitability of photoresist strip exposure with respect to different metal gate electrode in devices having the given high-k dielectric.

Using the simple diagram in FIG. 18, there are eight possible trajectories through the process sequence. These eight trajectories encompass all of the possible combinations of conventional and combinatorial processing illustrated. Those skilled in the art will understand that HPC techniques may be applied to other processes not illustrated such as anneal treatments, cleaning, rinsing, etching, surface treatments, surface functionalization, etc. As more variable process steps are included, the total number of required experiments increases dramatically. This illustrates the benefits of using HPC techniques to limit the number of substrates to a manageable number and minimize the cost of the development program.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for evaluating material composition in a combinatorial manner, the method comprising
   providing a substrate, wherein the substrate has a plurality of site isolated regions defined thereon, and wherein the substrate is one of a silicon-containing substrate, a germanium-containing substrate, a III-V substrate, or a II-VI substrate;
   depositing a plurality of test layer stacks comprising:
      depositing a first layer on the substrate using a first atomic layer deposition (ALD) process, wherein at least one characteristic of the first layer is varied in a combinatorial manner between the plurality of site isolated regions, wherein the first ALD process comprises sequentially introducing a metal source gas and an oxidizing agent, wherein the metal source gas is one of tetrakis(dimethylamino)hafnium (TDMAH), tetrakis(diethylamino)hafnium (TDEAH), or tetrakis (ethylmethylamino)hafnium (TEMAH), and wherein the oxidizing agent is one of oxygen (O2), ozone (O3), or water (H2O);
      depositing a second layer on the first layer in each of the plurality of site isolated regions, wherein at least one characteristic of the second layer is varied in a combinatorial manner between the plurality of site isolated regions, wherein the second layer is deposited by a physical vapor deposition (PVD) process, wherein the PVD layer comprises a material used to modify the composition of the first ALD layer, and wherein the PVD layer includes a layer of silicon; and
      depositing a third layer on the second layer, wherein the third layer is deposited by a second ALD process, wherein at least one of the first ALD process and the second ALD process includes a high-k dielectric material, and wherein the high-k dielectric material is one of aluminum oxide, hafnium oxide, zirconium oxide, tantalum oxide, or titanium oxide;
   annealing the substrate via an anneal process, wherein the anneal process comprises a post metallization anneal in a forming gas, wherein the anneal process is executed in a conventional, uniform manner, and wherein the anneal process is executed after the depositing of the first layer, the second layer, and the third layer on the substrate;
   comparing a characteristic of one of the first layer, the second layer, or the third layer in one site isolated region in the plurality of site isolated regions with the same characteristic of the same layer in a different site isolated region in the plurality of site isolated regions; and
   developing an all ALD process to deposit a final layer stack having same characteristics as a test layer stack deposited using the physical vapor deposition process.

2. The method of claim 1 further comprising
   measuring a characteristic of one of the first layer, the second layer, or the third layer within each of the plurality of site isolated regions.

3. The method of claim 1 further comprising
   developing the all ALD process to deposit selected layers having optimal characteristics,
   wherein the developing includes a screening process, and
   wherein the screening process comprises varying PVD characteristics in a combinatorial manner for an ALD base layer to measure or compare a strength of each characteristics.

4. The method of claim 1 wherein a thickness of the first layer or the third layer is between about 2 and 10 nm.

5. The method of claim 1 wherein a thickness of the second layer is between about 0.05 and 10 nm.

6. The method of claim 5 further comprising
   wherein the second layer includes an element different from the elements of the first layer deposited by the ALD process,
   wherein the second layer, the PVD layer is used to dope the ALD layer by providing a mixture or an alloy with the ALD layer.

7. The method of claim 6 wherein varying at least one characteristic of the second layer in a combinatorial manner between the plurality of site isolated regions comprises at least one of
   varying a thickness of the second layer,
   varying a composition of the second layer,
   varying a target of the PVD process, or
   varying a deposition condition of the PVD process.

8. The method of claim 7 wherein the thickness of the second layer is less than 1 monolayer.

9. The method of claim 1, further comprising
fabricating at least one of a test device, a capacitor, or transistor structure on the substrate subsequent to the processing of the substrate in a post metallization anneal.

10. The method of claim 1
wherein the first ALD process includes sequential exposure of multiple precursors
wherein after the first ALD process concludes the introducing the metal source gas and the oxidizing agent, depositing an aluminum oxide layer by the first ALD process using an aluminum-containing precursor of trimethyl aluminum together with an oxygen-containing precursor of water.

11. The method of claim 10
wherein the depositing an aluminum oxide layer by the first ALD process is done on the entire substrate in a combinatorial manner,
wherein the first layer is a dielectric layer.

12. The method of claim 10 wherein the ALD process for depositing the first layer can include between 5 and 20 ALD cycles.

13. The method of claim 1 wherein varying at least one characteristic of the first layer in a combinatorial manner between the each of the plurality of the site isolated regions comprises at least one of
varying a thickness of the first layer,
varying a composition of the first layer,
varying a precursor in the ALD process, or
varying a deposition condition of the ALD process.

14. A method for evaluating material composition in a combinatorial manner, the method comprising
providing a substrate, wherein the substrate has a plurality of site isolated regions defined thereon, wherein the substrate is a silicon-containing substrate, a germanium-containing substrate, a III-V substrate, or a II-VI substrate;
depositing a plurality of test layer stacks comprising:
depositing a first layer on the substrate in each of the plurality of site isolated regions, wherein at least one characteristic of the first layer is varied in a combinatorial manner between the plurality of site isolated regions, wherein the first layer is deposited by a first ALD process, creating a first ALD layer, and wherein the first layer deposited using the first ALD process includes sequential exposure of multiple precursors;
depositing a second layer on the first ALD layer in each of the plurality of site isolated regions, wherein at least one characteristic of the second layer is varied in a combinatorial manner between the plurality of site isolated regions, wherein the second layer is deposited by a physical vapor deposition (PVD) process, creating a PVD layer, wherein the PVD layer includes a layer of silicon, wherein the PVD layer comprises a material used to modify the composition of the first ALD layer; and
depositing a third layer on the second layer in each of the plurality of site isolated regions, wherein at least one characteristic of the third layer is varied in a combinatorial manner between the plurality of site isolated regions, wherein the third layer is deposited by the ALD process, creating a second ALD layer;
comparing a characteristic of one of the first layer, the second layer, or the third layer in one site isolated region in the plurality of site isolated regions with the same characteristic of the same layer in a different site isolated region in the plurality of site isolated regions; and
developing an all ALD process to deposit a final layer stack having same characteristics as a test layer stack deposited using the physical vapor deposition process.

15. The method of claim 14 further comprising annealing the substrate via an anneal process, wherein the anneal process comprises one of
a thermal anneal,
a reactive anneal with a reactive species, or
a plasma anneal.

16. The method of claim 14 further comprising
developing the all ALD process to deposit selected layers having optimal characteristics,
wherein the developing includes a screening process, and
wherein the screening process comprises varying PVD characteristics in a combinatorial manner for an ALD base layer to measure or compare a strength of each characteristics.

17. The method of claim 14 wherein varying at least one characteristic of the second layer in a combinatorial manner between the each of the plurality of site isolated regions comprises at least one of
varying a thickness of the second layer,
varying a composition of the second layer,
varying a target of the PVD process, or
varying a deposition condition of the PVD process.

18. The method of claim 14 wherein varying at least one characteristic of the first layer in a combinatorial manner between the each of the plurality of the site isolated regions comprises at least one of
varying a thickness of the first layer,
varying a composition of the first layer,
varying a precursor in the ALD process, or
varying a deposition condition of the ALD process.

19. The method of claim 14, further comprising
wherein the second layer includes an element different from the elements of the first layer deposited by the ALD process,
wherein the PVD layer is used to dope the ALD layer by providing a mixture or an alloy with the ALD layer.

* * * * *